(12) United States Patent
Wu et al.

(10) Patent No.: US 12,477,963 B2
(45) Date of Patent: Nov. 18, 2025

(54) CMOS-COMPATIBLE RESISTIVE RANDOM-ACCESS MEMORY DEVICES WITH A VIA DEVICE STRUCTURE

(71) Applicant: TetraMem Inc., Fremont, CA (US)

(72) Inventors: Mingche Wu, San Jose, CA (US);
Minxian Zhang, Amherst, MA (US);
Ning Ge, Danville, CA (US)

(73) Assignee: TetraMem Inc., San Jose, CA (US)

( * ) Notice: Subject to any disclaimer, the term of this patent is extended or adjusted under 35 U.S.C. 154(b) by 435 days.

(21) Appl. No.: 17/936,830

(22) Filed: Sep. 29, 2022

(65) Prior Publication Data

US 2024/0114813 A1  Apr. 4, 2024

(51) Int. Cl.
*H10B 63/00* (2023.01)
*H10N 70/00* (2023.01)

(52) U.S. Cl.
CPC ......... *H10N 70/8833* (2023.02); *H10B 63/80* (2023.02); *H10N 70/023* (2023.02); *H10N 70/063* (2023.02); *H10N 70/066* (2023.02); *H10N 70/068* (2023.02); *H10N 70/841* (2023.02)

(58) Field of Classification Search
CPC ............. H10N 70/8833; H10N 70/023; H10N 70/063; H10N 70/066; H10N 70/068; H10N 70/841; H10N 70/061; H10N 70/24; H10N 70/826; H10B 63/80; H10B 63/30
See application file for complete search history.

(56) References Cited

U.S. PATENT DOCUMENTS

| | | | |
|---|---|---|---|
| 2011/0155989 A1* | 6/2011 | Park | H10N 70/884 438/102 |
| 2017/0207387 A1* | 7/2017 | Yang | H10N 70/24 |
| 2017/0317143 A1* | 11/2017 | Chen | H01L 23/5226 |
| 2020/0388755 A1* | 12/2020 | Chang | H10N 70/041 |
| 2021/0035992 A1* | 2/2021 | Chen | H10B 53/30 |

OTHER PUBLICATIONS

International Searching Authority (ISA)/US, International Search Report for PCT/US23/75538, mailed Feb. 28, 2024, 2 pages.
International Searching Authority (ISA)/US, Written Opinion for PCT/US23/75538, mailed Feb. 28, 2024, 6 pages.

* cited by examiner

*Primary Examiner* — Omar F Mojaddedi
(74) *Attorney, Agent, or Firm* — Jaffery Watson Hamilton & DeSanctis LLP

(57) ABSTRACT

A crossbar circuit including a crossbar array and a periphery circuit is provided. A resistive random-access memory (RRAM) device of the crossbar array includes a bottom electrode fabricated on a first interconnect layer; a top electrode; and a filament-forming layer fabricated between the bottom electrode and the top electrode. A portion of the filament-forming layer and a portion of the top electrode are fabricated in a via in a first etch stop layer. The crossbar circuit further includes a second etch stop layer fabricated on the top electrode and a dielectric layer fabricated on the second etch stop layer. The top electrode is connected to a first metal via of a second interconnect layer fabricated in the second etch stop layer and the dielectric layer. The periphery circuit includes a metal via of the second interconnect layer that is fabricated in the dielectric layer and the first etch stop layer.

20 Claims, 25 Drawing Sheets

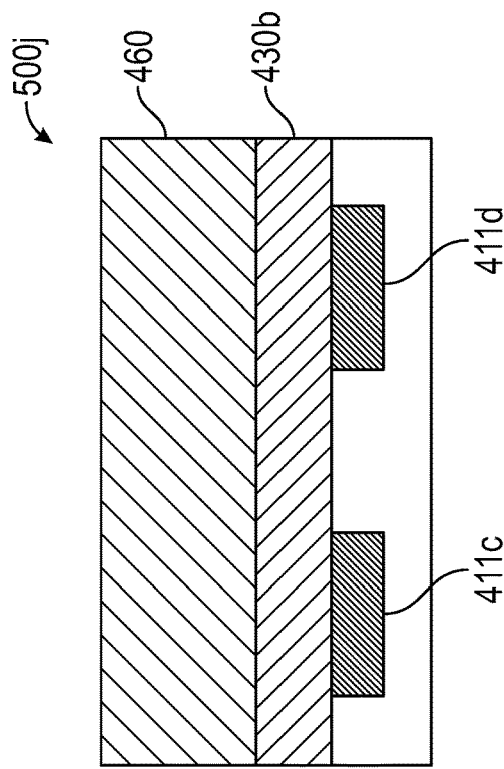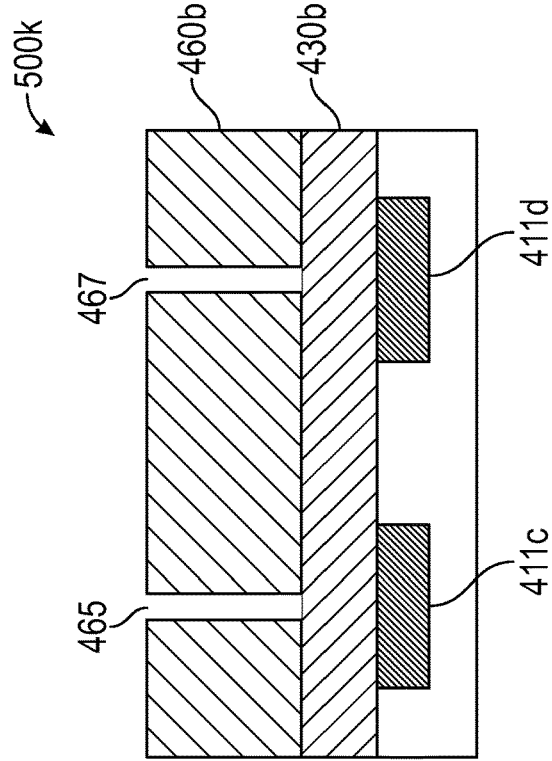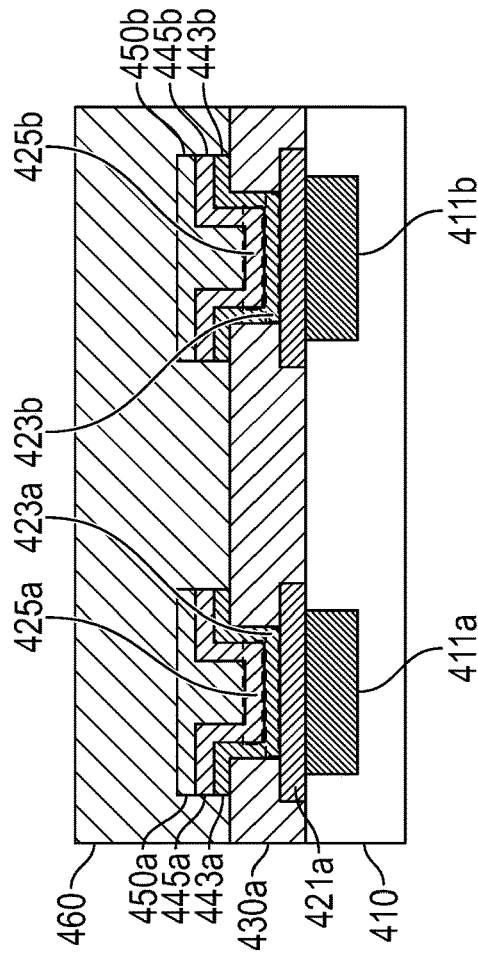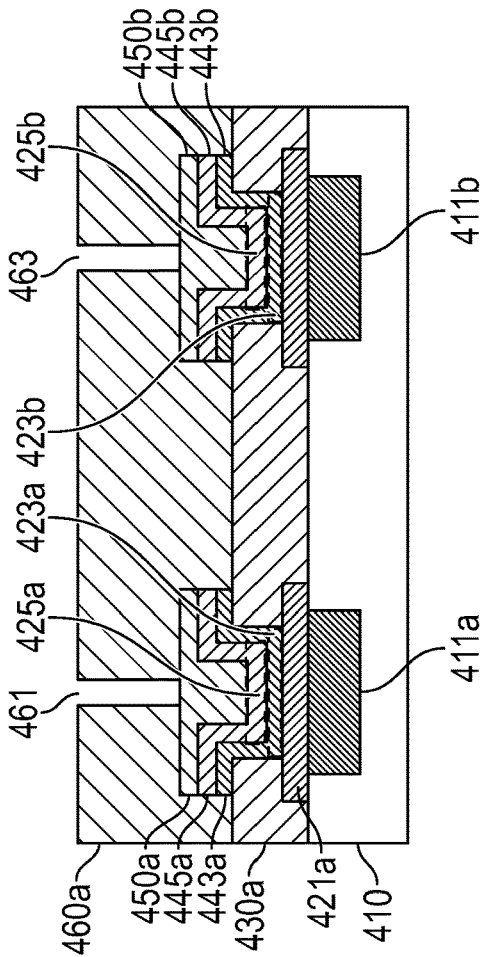
FIG. 5J
FIG. 5K

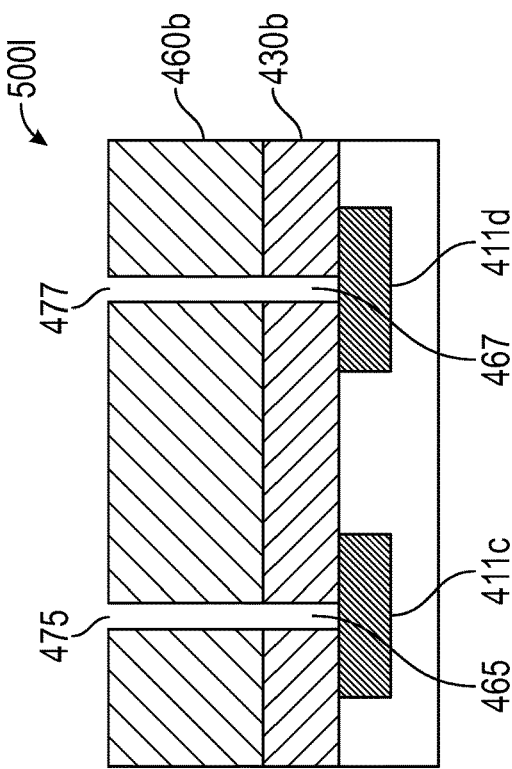
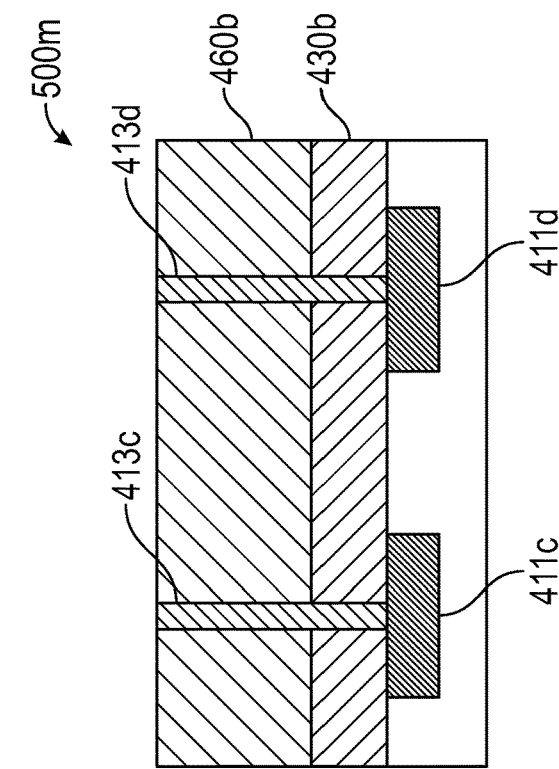
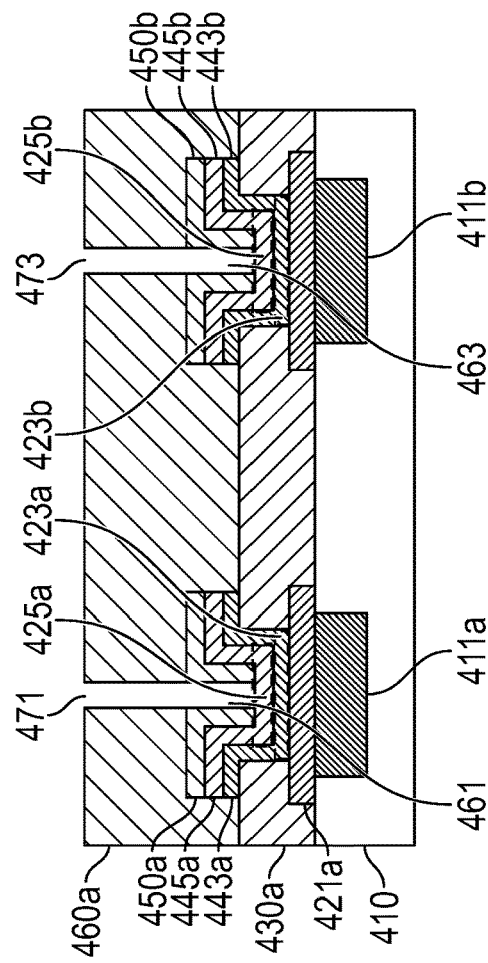
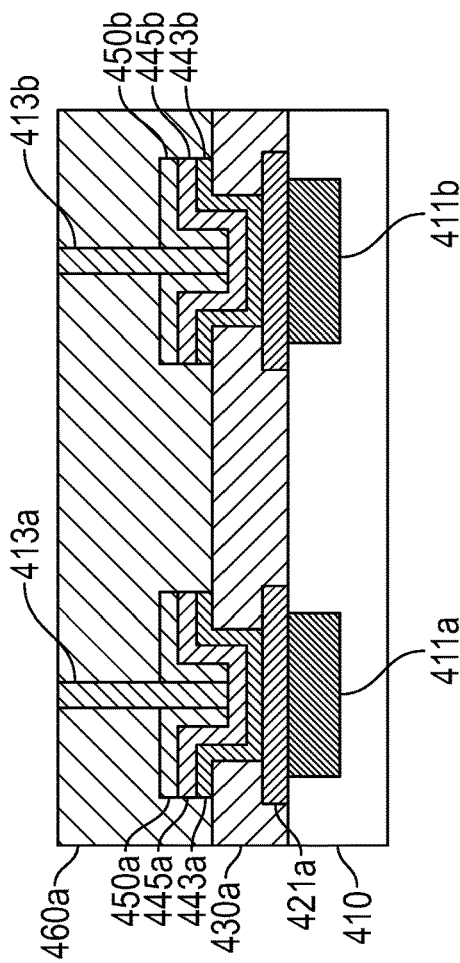
FIG. 5L
FIG. 5M

CMOS-COMPATIBLE RESISTIVE RANDOM-ACCESS MEMORY DEVICES WITH A VIA DEVICE STRUCTURE

TECHNICAL FIELD

The implementations of the disclosure generally relate to resistive random-access memory (RRAM) devices and, more specifically, to CMOS (complementary metal-oxide semiconductor)-compatible RRAM devices with a via device structure and methods for fabricating the same.

BACKGROUND

A resistive random-access memory (RRAM) device is a two-terminal passive device with tunable and non-volatile resistance. The resistance of the RRAM device may be electrically switched between a high-resistance state (HRS) and a low-resistance state (LRS) by applying suitable programming signals to the RRAM device. RRAM devices may be used to form crossbar arrays that may be used to implement in-memory computing applications, non-volatile solid-state memory, image processing applications, neural networks, etc.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In accordance with one or more aspects of the present disclosure, an apparatus is provided. The apparatus may be and/or include a crossbar circuit. The apparatus may include a first resistive random-access memory (RRAM) device, a first etch stop layer, and a second etch stop layer. The first RRAM device includes a first bottom electrode fabricated on a first interconnect layer; a first top electrode; and a first filament-forming layer fabricated between the first bottom electrode and the first top electrode. The first filament-forming layer may include at least one switching metal oxide. In some embodiments, a first filament-forming region of the first filament-forming layer and at least a portion of the first top electrode are fabricated in a first via in a first etch stop layer. In some embodiments, the second etch stop layer is fabricated on the first top electrode. The apparatus may further include a dielectric layer fabricated on the second etch stop layer; and a first metal via of a second interconnect layer fabricated in the second etch stop layer and the dielectric layer. In some embodiments, the first top electrode is connected to a bitline through the first metal via of the second interconnect layer.

In some embodiments, the first bottom electrode is fabricated on a first metal pad of the first interconnect layer. In some embodiments, the first metal pad of the first interconnect layer is connected to a first transistor.

In some embodiments, the switching metal oxide includes at least one of $HfO_x$, $TaO_x$, $TiO_x$, $NbO_x$, or $ZrO_x$.

In some embodiments, the first RRAM device further includes an interface layer fabricated between the first top electrode and the first filament-forming layer, wherein the interface layer includes at least one of $Al_2O_3$, $MgO$, $Y_2O_3$, or $La_2O_3$.

In some embodiments, the first RRAM device further includes an interface layer fabricated between the first bottom electrode and the first filament-forming layer, wherein the interface layer includes at least one of $Al_2O_3$, $MgO$, $Y_2O_3$, or $La_2O_3$.

In some embodiments, the dielectric layer includes $SiO_2$.

In some embodiments, the first etch stop layer includes at least one of silicon nitride or silicon oxynitride.

In some embodiments, the second etch stop layer includes at least one of silicon nitride or silicon oxynitride.

In some embodiments, the apparatus further includes a second RRAM device. The second RRAM device includes: a second bottom electrode fabricated on the first interconnect layer; a second top electrode; and a second filament-forming layer fabricated between the second bottom electrode and the second top electrode. In some embodiments, a second filament-forming region of the second filament-forming layer and at least a portion of the second top electrode are fabricated in a second via in the first etch stop layer.

In some embodiments, the second bottom electrode is fabricated on a second metal pad of the first interconnect layer. In some embodiments, the second metal pad of the first interconnect layer is connected to a second transistor.

In some embodiments, a second metal via of the second interconnect layer is fabricated in the dielectric layer and the second etch stop layer. The second top electrode is connected to a bitline through the second metal via of the second interconnect layer.

In some embodiments, the apparatus further includes a periphery circuit. The periphery circuit includes a third metal pad of the first interconnect layer; and a third metal via of the second interconnect layer. In some embodiments, a portion of the first etch stop layer is fabricated on the third metal pad of the first interconnect layer. The third metal via is fabricated in a third via trench positioned in the dielectric layer and the portion of the first etch stop layer. In some embodiments, the periphery circuit does not include the second etch stop layer.

In some embodiments, the third metal via of the second interconnect layer connects the third metal pad of the first interconnect layer to a metal pad of a third interconnect layer.

In some embodiments, methods for fabricating the apparatus are provided. The methods include fabricating one or more bottom electrodes on a substrate including a first interconnect layer; fabricating a first etch stop layer on the substrate and the one or bottom electrodes; fabricating one or more vias in the first etch stop layer to expose a portion of each of the bottom electrodes; fabricating a switching oxide layer on the first etch stop layer, wherein at least a portion of the switching oxide layer is fabricated on the exposed portion of the bottom electrodes; fabricating a top electrode layer on the switching oxide layer; fabricating a second etch stop layer on the switching oxide layer; and fabricating one or more top electrodes by selectively removing one or more portions of the second etch stop layer and the top electrode layer.

In some embodiments, fabricating the one or more bottom electrodes on the first interconnect layer includes fabricating a first bottom electrode on a first metal pad of the first interconnect layer. In some embodiments, fabricating the one or more vias in the first etch stop layer includes fabricating a first via in the first etch stop layer to expose a portion of the first bottom electrode.

In some embodiments, fabricating the one or more top electrodes includes: patterning the second etch stop layer; and etching the second etch stop layer and the top electrode layer.

In some embodiments, fabricating the one or more bottom electrodes on the first interconnect layer includes fabricating a second bottom electrode on a second metal pad of the first interconnect layer. In some embodiments, fabricating the one or more vias in the first etch stop layer includes fabricating a second via in the first etch stop layer to expose a portion of the second bottom electrode.

In some embodiments, the methods further includes fabricating a dielectric layer on the second etch stop layer; and fabricating a second interconnect layer that connects the first interconnect layer to a third interconnect layer, wherein a first metal via of the second interconnect layer is fabricated in the dielectric layer and the second etch stop layer, and wherein a first metal pad of the first interconnect layer is connected to a first metal pad of the third interconnect layer via the first metal via of the second interconnect layer.

In some embodiments, fabricating the second interconnect layer includes: patterning and etching the dielectric layer to fabricate a first portion of a first via trench; patterning and etching the second etch stop layer to fabricate a second portion of the first via trench; and depositing a metallic material in the first via trench to fabricate the first metal via of the second interconnect layer.

In some embodiments, the etching of the dielectric layer stops on the second etch stop layer. The etching of the second etch stop layer stops on the top electrode layer.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIGS. 5B-5M are diagrams illustrating cross-sectional views of structures for fabricating the crossbar circuit of FIG. 5A in accordance with some embodiments of the present disclosure.

DETAILED DESCRIPTION

Figure 1:
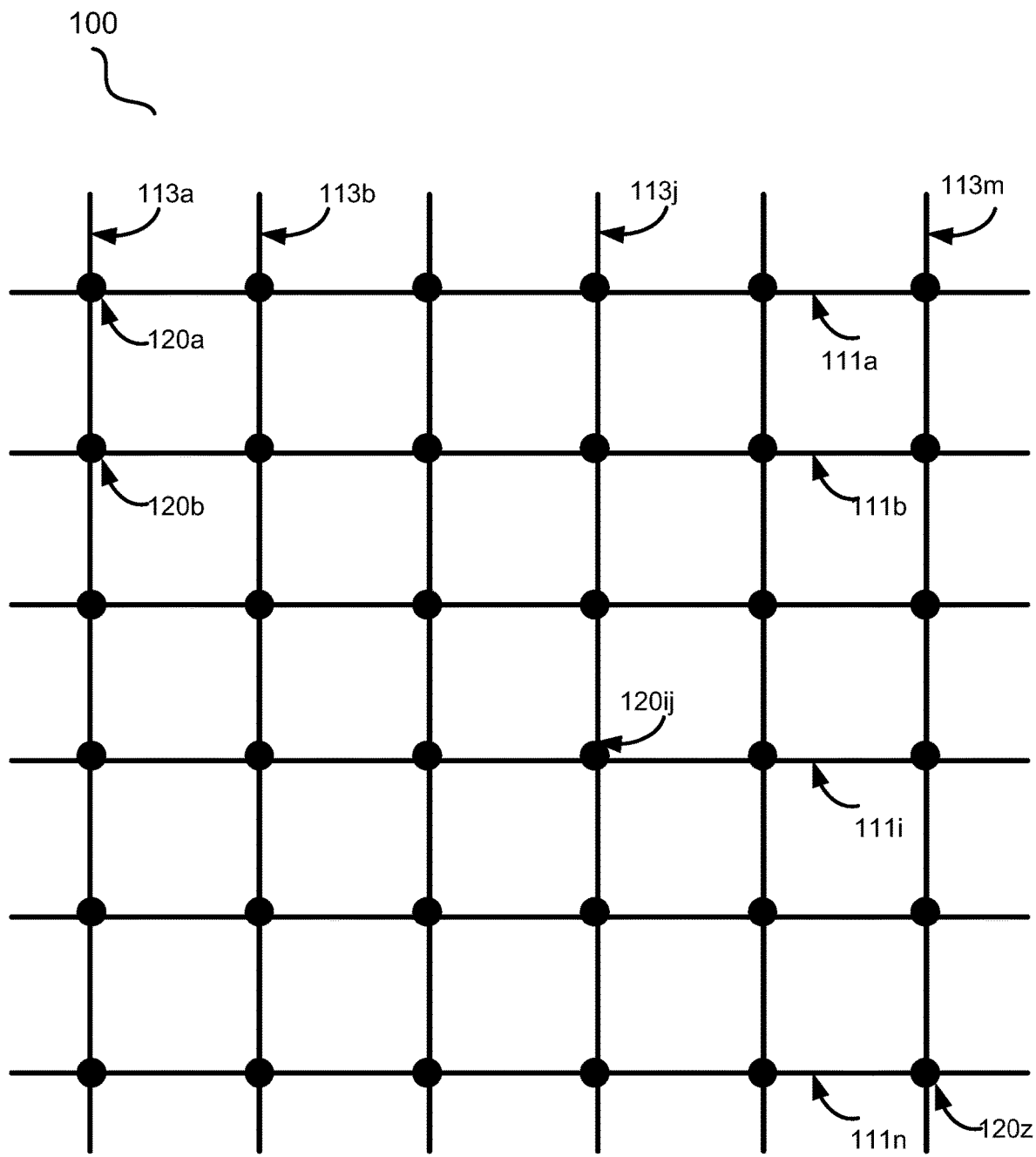
FIG. 1 is a schematic diagram illustrating an example of a crossbar circuit in accordance with some embodiments of the present disclosure.

Aspects of the disclosure provide resistive random-access memory (RRAM) devices and methods for fabricating the RRAM devices. An RRAM device is a two-terminal passive device with tunable resistance. The RRAM device may include a bottom electrode, a top electrode, and a switching oxide layer fabricated between the bottom electrode and the top electrode. The bottom electrode may include a nonreactive metal, such as platinum (Pt), palladium (Pd), etc. The top electrode may include a reactive metal, such as tantalum (Ta). The electrode including the nonreactive metal is also referred to herein as the "nonreactive electrode." The switching oxide layer may include a transition metal oxide, such as hafnium oxide ($HfO_x$) or tantalum oxide ($TaO_x$). The RRAM device may be in an initial state or virgin state and may have an initial high resistance before it is subject to a suitable electrical stimulation (e.g., a voltage or current signal applied to the RRAM device). The RRAM device may be tuned to a lower resistance state from the virgin state via a forming process or from a high-resistance state (HRS) to a lower resistance state (LRS) via a setting process. The forming process may refer to programming a device starting from the virgin state. The setting process may refer to programming a device starting from the high resistance state (HRS). After the reactive metal electrode being deposited on the switching oxide, the reactive metal can absorb oxygen from the switching oxide layer and create oxygen vacancies in the switching oxide layer, and oxygen ions can migrate in the switching oxide through a vacancy mechanism. During a forming process, a suitable programming signal (e.g., a voltage or current signal) may be applied to the RRAM device, which may cause a drift of oxygen ions to migrate from the switching oxide to the reactive electrode. As a result, a conductive channel or filament may form through the switching oxide layer (e.g., from the reactive electrode to the non-reactive electrode). The RRAM device may then be reset to a high-resistance state by applying a reset signal (e.g., a voltage signal, a current signal) to the RRAM device. The application of the reset signal to the RRAM device may cause oxygen ions to migrate back to the switching oxide layer and may thus interrupt the conductive filament. The RRAM device may be electrically switched between a high-resistance state and a low-resistance state by applying suitable programming signals (e.g., voltage signals, current signals, etc.) to the RRAM device. In a crossbar array circuit, the programming signals may be provided to the designated RRAM device via a selector, such as a transistor.

One of the existing approaches for fabricating a crossbar array of RRAM devices involves fabricating bottom electrode wires, a switching oxide layer on the bottom electrode wires, and top electrode wires on the switching oxide layer. The RRAM devices are formed at each cross point of the bottom electrode wires and the top electrode wires. The size of an RRAM device fabricated using the existing approaches is thus limited by the dimensions (e.g., widths) of the bottom electrode wires and the top electrode wires. As a result, scaling down such an RRAM device may require the reduction of the dimensions of the bottom electrode wires and/or the top electrode wires and may thus increase the resistance of the bottom electrode wires and the top electrode wires. The high wire resistance may act as a voltage divider and may reduce the voltage available to an RRAM device during its operation.

To address the aforementioned and other deficiencies of the conventional RRAM devices, the present disclosure provides mechanisms for fabricating RRAM devices with a via structure that may enhance the performance of the RRAM devices and be implemented for low-power IMC applications. In accordance with some embodiments of the present disclosure, fabricating an RRAM device may involve provide a substrate including a first interconnect layer that includes a plurality of metal pads and/or metal vias. The substrate may further include one or more transistors. The metal pads and/or metal vias of the first interconnect layer may be connected to the transistors.

A bottom electrode layer may be fabricated on the substrate and the interconnect layer. The bottom electrode layer may be patterned and etched to fabricate bottom electrodes of the RRAM devices. In some embodiments, a first bottom electrode and a second bottom electrode may be fabricated on a first metal pad and a second metal pad of the first interconnect layer, respectively. The first metal pad and the second metal pad may be connected to a first transistor and a second transistor, respectively.

A first etch stop layer may be fabricated on the bottom electrodes and the top surface of the substrate. The first etch stop layer may include any suitable material that may be resistant to the etching of a dielectric layer to be fabricated on the first etch stop layer, due to a high etching selectivity or a high ratio between the etch rate of the dielectric material and the etch rate of the etch stop material. In some embodiments, the first etch stop layer includes silicon nitride and/or silicon oxynitride. The first etch stop layer may be patterned and etched to fabricate one or more vias and to expose a portion of each of the bottom electrodes.

A switching oxide layer may be fabricated on the top surface of the etched first etch stop layer, along the sidewalls of the vias, and on the exposed portions of the bottom electrodes. The switching oxide layer may be an ultra-thin layer of the switching metal oxide(s) (e.g., a layer about or thinner than 2 nm). Due to the ultra-thin thickness of the switching oxide layer, the fabrication of the switching oxide layer partially fills the vias. One or more portions of the switching oxide layer may be fabricated on the exposed portions of the bottom electrodes. The remaining portions of the switching oxide layer may be fabricated on the first via sidewall and the top surface of the first etch stop layer and do not contact the exposed portions of the bottom electrodes. As such, the switching metal oxide in the remaining portions of the filament-forming layer does not participate in the forming and switching of the RRAM devices since there is no electric field across these portions of the switching oxide layer. As such, the portions of the switching oxide layer that are deposited on the exposed bottom electrodes function as filament-forming regions in which a filament may form during a forming process, a setting process, or a resetting process. The critical device size of each of the RRAM devices is thus defined by the dimension of the filament-forming region and the opening size of the first via (also referred to as a via device structure) instead of the dimensions of the top electrode wires and the bottom electrode wires.

A top electrode layer may then be fabricated on the switching oxide layer, for example, by depositing one or more reactive metallic materials on the switching oxide layer, along the sidewalls of the second via, and over the entire top surface of the first etch stop layer.

A second etch stop layer may be fabricated on the top electrode layer. The fabrication of the second etch stop layer may fill the vias. One or more portions of the second etch stop layer may extend along the sidewalls of the vias and cover the top surface of the top electrode layer.

The second etch stop layer and the top electrode layer may be selectively etched to fabricate top electrodes of the RRAM devices. The etching of the second etch stop layer and the top electrode layer may stop on the switching oxide layer. In some embodiments, the switching oxide layer may be patterned and etched. The etching of the switching oxide layer may stop on the etched first etch stop layer and may expose one or more portions of the first etch stop layer. As such, the first etch stop layer may protect the via device structures during the etching of the top electrode layer and the switching oxide layer.

In some embodiments, a dielectric layer (e.g., a layer of silicon oxide) may be fabricated on the etched second etch stop layer and the exposed first etch stop layer. A second interconnect layer including one or more metal pads and/or metal vias may be fabricated in the dielectric layer. For example, the dielectric layer may be patterned and etched to fabricate one or more via trenches in the dielectric layer. The etching of the dielectric layer may be stopped on the second etch stop layer. The via trenches in the dielectric layer may then be expanded to contact the top electrodes by patterning and etching the etched second etch stop layer. The etching of the second etch stop layer may stop on the top electrodes.

In some embodiments, the crossbar circuit may also include a periphery circuit that does not include an RRAM device. The periphery circuit may include one or more transistors for implementing logic circuits. The periphery circuit may include a portion of the first interconnect layer, e.g., a third metal pad of the first interconnect layer. A third metal via of the second interconnect layer may be fabricated in the dielectric layer and the etched first etch stop layer. The third metal via may contact the third metal pad of the first interconnect layer.

The third metal via may be fabricated with the first metal via, the second metal via, etc. of the second interconnect layer. For example, the dielectric layer may be patterned and etched to fabricate the top portion of the first via trench, the top portion of the second via trench, and the top portion of a third via trench in the periphery circuit. As the periphery circuit does not include the second etch stop layer, the etching of the dielectric layer in the periphery circuit may stop on a portion of the first etch stop layer that is fabricated in the periphery circuit. The portion of the first etch stop layer may then be etched to expand the third via trench to contact the third metal pad of the first interconnect layer. As such, the dielectric layer in the periphery circuit may be etched through to establish metal contacts to bottom vias.

The etch stop layers described herein may protect the via device structures during the etching of the dielectric layer for fabricating the periphery circuit and may enable high etching selectivity during the etching of the dielectric layer. The etch stop layers may function as etching masks in some of the etching processes described herein and may thus reduce manufacturing costs. The etch stop layers (e.g., SiN layers) may also function as a barrier to isolate the oxygen diffusion from the dielectric materials to the RRAM devices for better device uniformity and device operation control. The mechanisms for fabricating the crossbar circuit as described herein may enable the fabrication of RRAM devices without using spacers during the etching processes and may facilitate the integration of the RRAM fabrication into the lower metal CMOS fabrication flow.

FIG. 1 is a schematic diagram illustrating an example 100 of a crossbar circuit in accordance with some embodiments of the present disclosure. As shown, crossbar circuit 100 may include a plurality of interconnecting electrically conductive wires, such as one or more row wires 111a, 111b, . . . , 111i, . . . , 111n, and column wires 113a, 113b, . . . , 113j, . . . , 113m for an n-row by m-column crossbar array. The crossbar circuit 100 may further include cross-point devices 120a, 120b, . . . , 120z, etc. Each of the cross-point devices may connect a row wire and a column wire. For example, the cross-point device 120ij may connect the row wire 111i and the column wire 113j. In some embodiments, crossbar circuit 100 may further include digital-to-analog converters (DAC, not shown), analog-to-digital converters (ADC, not shown), switches (not shown), and/or any other suitable circuit components for implementing a crossbar-based apparatus. The number of the column wires 113a-m and the number of the row wires 111a-n may or may not be the same.

Row wires 111 may include a first row wire 111a, a second row wire 111b, . . . , 111i, . . . , and a n-th row wire 111n. Each of row wires 111a, . . . , 111n may be and/or include any suitable electrically conductive material. In some embodiments, each row wire 111a-n may be a metal wire.

Column wires 113 may include a first column wire 113a, a second column wire 113b, . . . , and an m-th column wire 113m. Each of column wires 113a-m may be and/or include any suitable electrically conductive material. In some embodiments, each column wire 113a-m may be a metal wire.

Each cross-point device 120 may be and/or include any suitable device with tunable resistance, such as a memristor, phase-change memory (PCM) devices, floating gates, spintronic devices, RRAM, static random-access memory (SRAM), etc. In some embodiments, one or more cross-point devices 120 may include an RRAM device as described in connection with FIGS. 3A-6E. Each cross-point device 120 may be and/or include a cross-point device as described in connection with FIG. 2 below.

Crossbar circuit 100 may perform parallel weighted voltage multiplication and current summation. For example, an input voltage signal may be applied to one or more rows of crossbar circuit 100 (e.g., one or more selected rows). The input signal may flow through the cross-point devices of the rows of the crossbar circuit 100. The conductance of the cross-point device may be tuned to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each column wire and may be accumulated according to Kirchhoff's current law. This may enable in-memory computing (IMC) via parallel multiplications and summations performed in the crossbar arrays.

Figure 2:
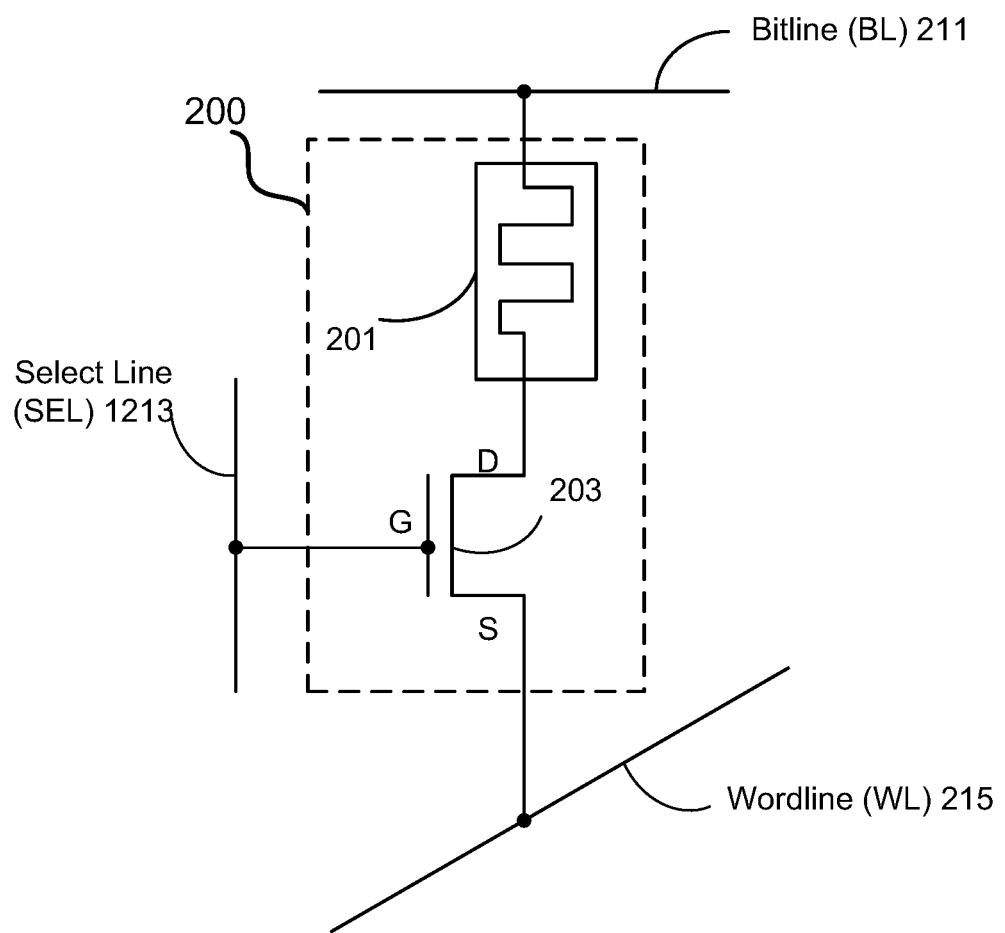
FIG. 2 is a schematic diagram illustrating an example of a cross-point device in accordance with some embodiments of the present disclosure.

FIG. 2 is a schematic diagram illustrating an example 200 of a cross-point device in accordance with some embodiments of the present disclosure. As shown, cross-point device 200 may connect a bitline (BL) 211, a select line (SEL) 213, and a wordline (WL) 215. The bitline 211 and the wordline 215 may be a column wire and a row wire as described in connection with FIG. 1, respectively.

Cross-point device 200 may include an RRAM device 201 and a transistor 203. A transistor is a three-terminal device. The terminals of the transistors may be marked as gate (G), source (S), and drain (D), respectively. The transistor 203 may be serially connected to RRAM device 201. As shown in FIG. 2, the first electrode of the RRAM device 201 may be connected to the drain of transistor 203. The second electrode of the RRAM device 201 may be connected to the bitline 211. The source of the transistor 203 may be connected to the wordline 215. The gate of the transistor 203 may be connected to the select line 213. RRAM device 201 may be and/or include an RRAM device 340, 440a, 440b, and/or 600a-e as described in connection with FIGS. 3A-6E below. Cross-point device 200 may also be referred to as a one-transistor-one-resistor (1T1R) configuration. The transistor 203 may perform as a selector as well as a current controller, which may set the current compliance, to the RRAM device 201 during programming. The gate voltage on transistor 203 can set current compliances to cross-point device 200 during programming and can thus control the conductance and analog behavior of cross-point device 200. For example, when cross-point device 200 is set from a high-resistance state to a low-resistance state, a set signal (e.g., a voltage signal, a current signal) may be provided via the bitline (BL) 211. Another voltage, also referred as a select voltage or gate voltage, may be applied via the select line (SEL) 213 to the transistor gate to open the gate and set the current compliance, while the wordline (WL) 215 may be set to ground. When cross-point device 200 is reset from the low-resistance state to the high-resistance state, a gate voltage may be applied to the gate of the transistor 203 via the select line 213 to open the transistor gate. Meanwhile, a reset signal may be sent to the RRAM device 201 via the wordline 215, while the bitline 211 may be set to ground. In some embodiments, the width of the bitline 211 and/or the wordline 215 may be about or greater than 1 μm.

Figure 3A:
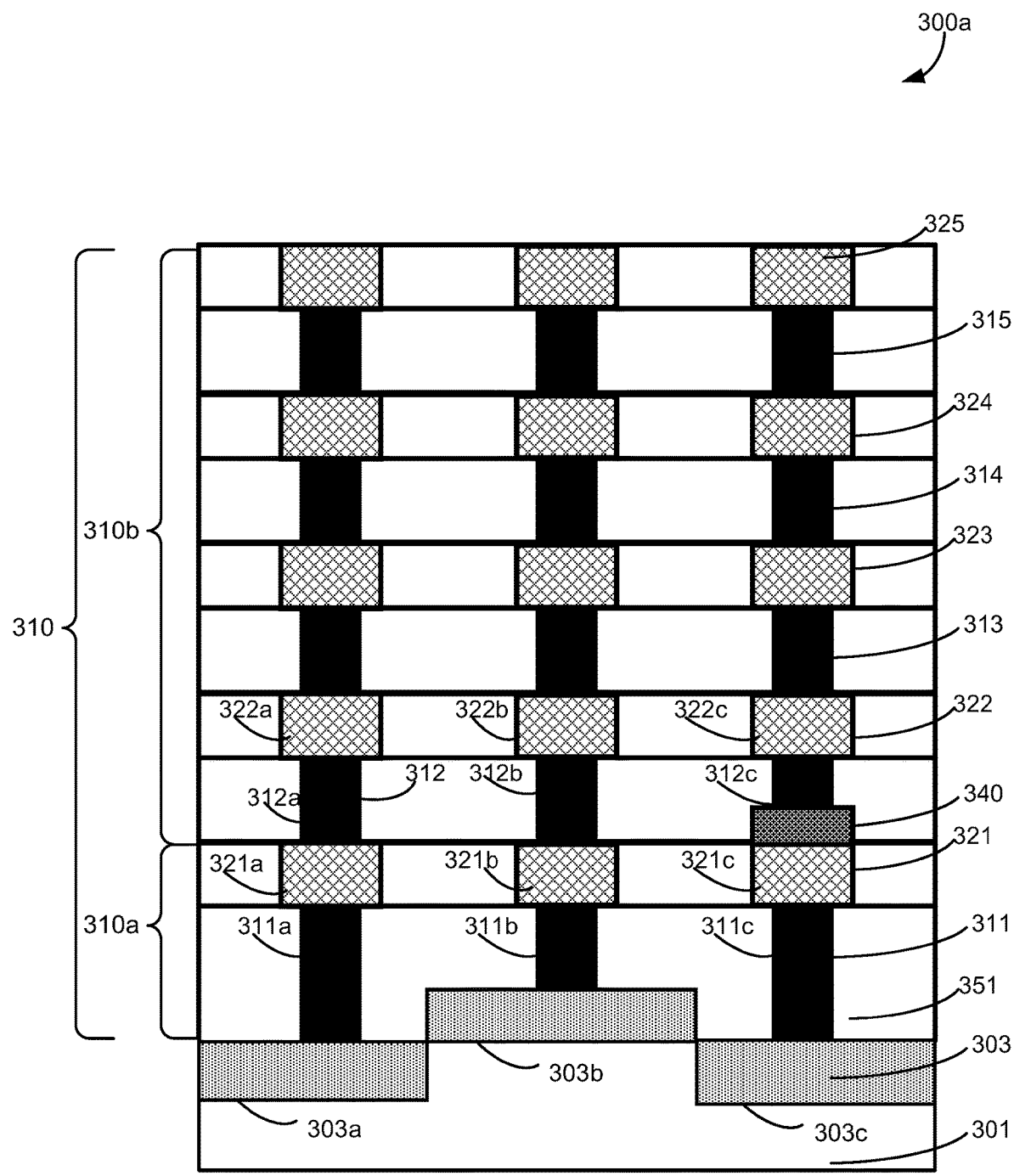
FIGS. 3A and 3B are schematic diagrams illustrating cross-sectional views of example semiconductor devices including a CMOS-compatible RRAM in accordance with some embodiments of the present disclosure.
Figure 3B:
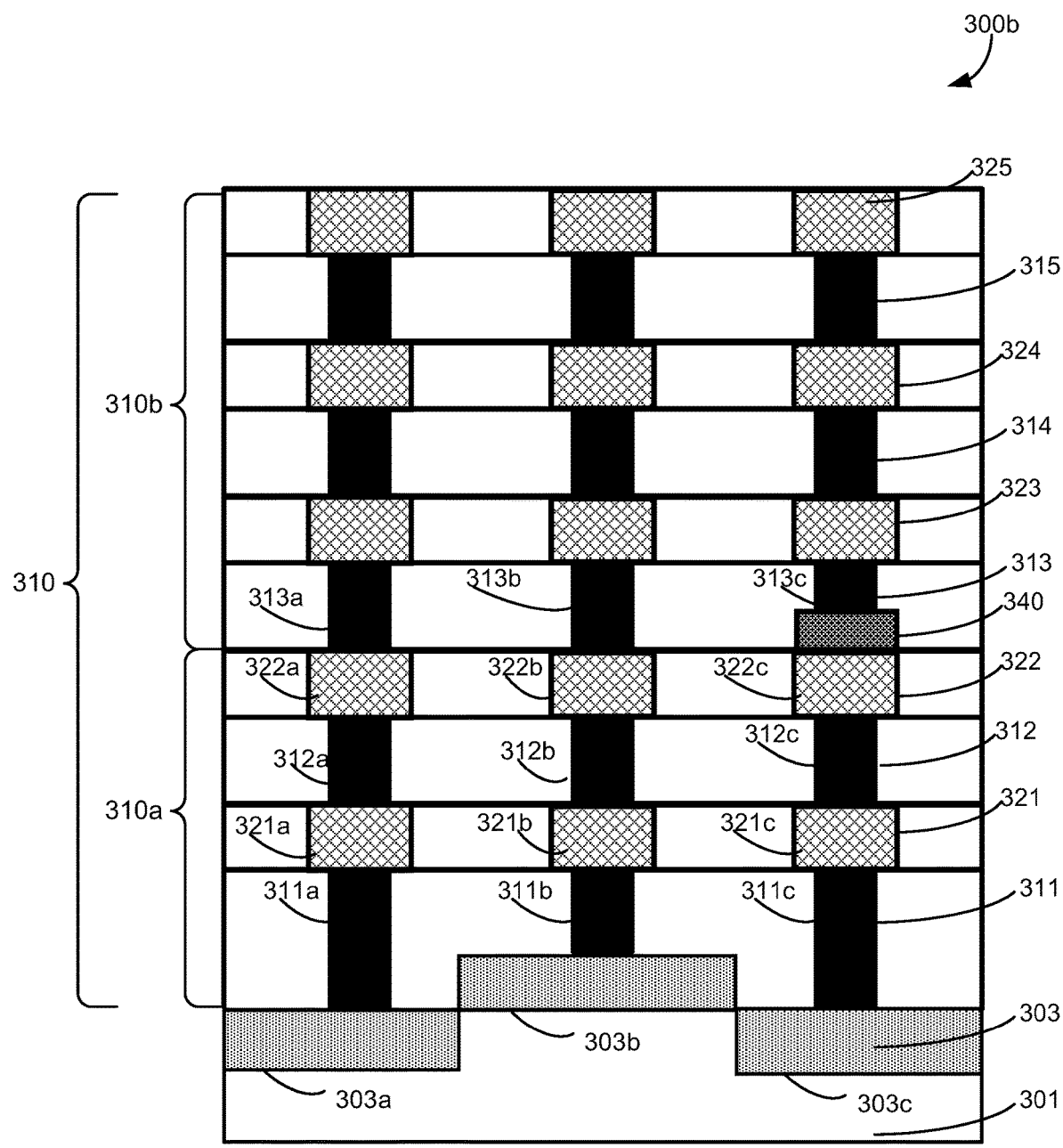

FIGS. 3A and 3B are schematic diagrams illustrating cross-sectional views of example semiconductor devices 300a and 300b including a CMOS-compatible RRAM in accordance with some embodiments of the present disclosure.

As shown, a transistor 303 is fabricated on a substrate 301. The transistor 303 may include a source region 303a, a gate 303b, and a drain region 303c. While one transistor is shown in FIG. 3A, this is merely illustrative. Multiple transistors (not shown) may be fabricated on the substrate 301 in some embodiments. The transistors may be isolated by suitable insulator and/or dielectric materials.

The semiconductor device 300a may include interconnect layers 310 fabricated on the transistor 303 and the substrate 301. Each of the interconnect layers 310 may provide electrical connectivity between the transistor 303 and/or one or more other devices (e.g., one or more other transistors, one or more other RRAM devices, etc.). The interconnect layers 310 may include, for example, via layers (or via layers) 311, 312, 313, 314, . . . , and 315 and metal layers (or pad layers) 321, 322, 323, 324, . . . , and 325. Although via layers up to 315 and metal layers up to 325 are shown in FIG. 3A-3B for illustration simplification, additional via layers and pad layers may be fabricated for integration and/or interconnection needs. Each of the via layers may include one or more metal vias. Each of the metal vias may include a suitable metallic material, such as Al, Cu, W, etc. Each of the metal layers may include one or more metal pads. Each of the metal pads may include a suitable metallic material, such as Al, Cu, W, etc. For example, the via layer 311 may include metal vias 311a, 311b, and 311c that may be connected to the source region 303a, the gate 303b, and the drain region 303c of the transistor 303, respectively. In some embodiments, the via layer 311 may include tungsten (W) vias and doped polycrystalline Si (poly-Si) terminals where poly-Si terminals may directly contact the gate 303b, the source region 303a, and the drain region 303c of the transistor 303. The tungsten vias may directly contact the poli-Si terminals. The other via layers and metal layers above the via layer 311 may be fabricated with Cu, W, Al, etc. The metal layer 321 may include metal pads 321a, 321b, and 321c. The metal pads 321a, 321b, and 321c may be connected to the metal vias 311a, 311b, and 311c, respectively.

Each of the interconnect layers may be fabricated by fabricating a dielectric layer, patterning the dielectric layer, and depositing suitable metals in the patterned dielectric layer. The dielectric layer may include any suitable dielectric material, such as silicon nitride ($Si_3N_4$), silicon dioxide ($SiO_2$), etc. For example, to fabricate the first via layer 311, a dielectric layer 351 may be fabricated on the substrate 301 and the transistor 303. The dielectric layer 351 may be processed utilizing any suitable deposition techniques. For example, the dielectric layer 351 may be patterned and filled by metal deposition to fabricate the metal vias 311a, 311b, and 311c in the dielectric layer 351. In some embodiments, one or more interconnect layers 310 may be fabricated utilizing a dual-damascene fabrication process (e.g., process 900 of FIG. 9A).

As shown, a pair of neighboring metal layers may be connected through a via layer fabricated between the neighboring metal layers. For example, a first metal layer 321 may be connected to a second metal layer 322 through a via layer 312. In particular, the metal pad 322a of the metal layer 322 may be connected to the metal pad 321a of the metal layer 321 through the metal via 312a. The metal pad 322b of the metal layer 322 may be connected to the metal pad 321b of the metal layer 321 through the metal via 312b. The metal pad 322c of the metal layer 322 may be connected to the metal pad 321c of the metal layer 321 through the metal via 312c.

The interconnect layers 310 may have varying dimensions. The sizes of the metal pads of the metal layers 321, 322, 323, 324, . . . , and 325, may increase sequentially. Similarly, the sizes of the metal via in the via layers 311, 312, 313, 314, . . . , and 315, may increase sequentially. For example, the semiconductor device 300a may be part of a 65 nm technology node. The width and the spacing of the metal pads of the metal layer 321 may be about 90 nm. The width and the spacing of the metal pads of the metal layers 322 and 323 may be about 100 nm. The width and the spacing of the metal pads of the metal layers 325 may be about 400 nm.

An RRAM device 340 may be fabricated during the fabrication of the interconnect layers 310. As such, the RRAM device 340 is referred to as a CMOS-compatible RRAM device. For example, one or more first interconnect layers 310a may be fabricated on the transistor 303 and/or the substrate 301. The RRAM device 340 may be fabricated on a metal pad or a metal via of the top interconnect layer of the first interconnect layers 310a. One or more second interconnect layers 310b may then be fabricated on the RRAM device 340 and the first interconnect layers 310a. More particularly, for example, a metal pad or metal via of the bottom interconnect layer of the second interconnect layers 310b may be fabricated on the RRAM device 340 and may directly contact the RRAM device 340. In some embodiments, as shown in FIG. 3A, the first interconnect layers 310a may include the via layer 311 and the metal layer 321. The metal layer 321 may be regarded as being the top interconnect layer of the first interconnect layers 310a. The RRAM device 340 may be fabricated on the metal pad 321c of the metal layer 321. The RRAM device 340 is connected to the drain region 303c of the transistor 303 through the metal pad 321c of the metal layer 321 and the metal via 311c of the via layer 311. The metal via 312c of the via layer 312 may be fabricated on the RRAM device 340 and may be connected to a bitline of a circuit including the RRAM device 340 (e.g., the bitline 211 of FIG. 2). The metal vias 312a and 312b of the via layer 312 may be fabricated on the metal pads 321a and 321b, respectively. The metal layer 312 may be regarded as being the bottom interconnect layer of the second interconnect layers 310b. The second interconnect layers 310b may include one or more metal layers and/or via layers fabricated on the metal layer 312 (e.g., metal layers 322, 323, 324, and 325 and via layers 313, 314, and 315). The RRAM device 340 may include one or more RRAM devices as described in connection with FIGS. 4A-6E below.

In some embodiments, as shown in FIG. 3B, the RRAM device 340 may be fabricated on the metal pad 322c of the metal layer 322. The via layer 313 may be fabricated on the RRAM device 340. In particular, the metal via 313c of the via layer 313 is fabricated on the RRAM device 340 and directly contacts the RRAM device 340. In such embodiments, the first interconnect layers 310a may include the via layer 311, the metal layer 321, the via layer 312, and the metal layer 322. The metal layer 322 may be regarded as being the top interconnect layer of the first interconnect layers 310a. The second interconnect layers 310b may include the via layers 313, 314, and 315 and the metal layers 323, 324, and 325. The via layer 313 may be regarded as the bottom interconnect layer of the second interconnect layers 310b.

Although the total processing steps involved in fabricating the interconnect layers 310 in FIGS. 3A and 3B may be the same, fabricating the first interconnect layers 310a in FIG. 3B includes more steps than fabricating the first interconnect layers 310a in FIG. 3A, while fabricating the second interconnect layers 310b in FIG. 3B includes fewer steps than fabricating the second interconnect layers 310b in FIG. 3A. The RRAM device 340 is connected to the drain region 303c of the transistor 303 through the metal pad 322c of the metal layer 322, the metal via 312c of the via layer 312, the metal pad 321c of the metal layer 321, and the metal via 311c of the via layer 311. Metal via 313c of the via layer 313 may be fabricated on the RRAM device 340 and may be connected to the bitline of the circuit (e.g., the bitline 211 of FIG. 2). Metal vias 313a and 313b of the via layer 313 may be fabricated on the metal pads 322a and 322b, respectively.

While certain interconnect layers (e.g., metal layers and via layers) are shown in FIGS. 3A-3B, this is merely illustrative. The semiconductor device 300a may include any suitable number of interconnect layers for implementing various integrated circuits. The first interconnect layers 310*a* and the second interconnect layers 310*b* may include any suitable number of interconnect layers. For example, the RRAM device 340 may be fabricated on the metal layer 323 in some embodiments.

FIGS. 4A-4M are schematic diagrams illustrating cross-sectional views of example structures 400*a*-400*l* for fabricating an example 400 of a semiconductor device including CMOS-compatible RRAM devices in accordance with some embodiments of the present disclosure.

Figure 4A:
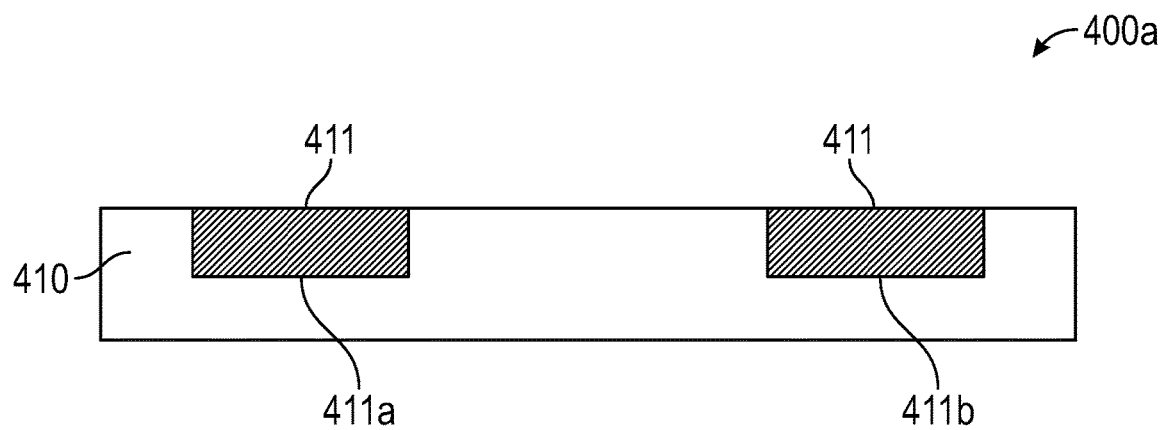
FIGS. 4A-4M are schematic diagrams illustrating cross-sectional views of example structures for fabricating a semiconductor device including CMOS-compatible RRAM devices in accordance with some embodiments of the present disclosure.

As shown in FIG. 4A, a substrate 410 may be provided. Substrate 410 may include one or more layers of any suitable material that may serve as a substrate for fabricating an RRAM device, such as silicon (Si), silicon dioxide ($SiO_2$), silicon nitride ($Si_3N_4$), aluminum oxide ($Al_2O_3$), aluminum nitride (AlN), etc. In some embodiments, substrate 410 may include diodes, transistors, interconnects, integrated circuits, etc. Substrate 410 may include a driving circuit including one or more electrical circuits (e.g., an array of electrical circuits) that may be individually controllable. In some embodiments, the driving circuit may include one or more complementary metal-oxide-semiconductor (CMOS) drivers. In some embodiments, substrate 410 may include one or more dielectric layers and interconnect layers as described in connection with FIGS. 3A-3B. For example, substrate 410 may include substrate 301, transistor 303, metal vias 311*a*-311*c*, etc.

As illustrated in FIG. 4A, substrate 410 may include a first interconnect layer 411 including one or more metal pads and/or metal vias. For example, first metal layer 411 may include metal pads 411*a* and 411*b*. Metal pads 411*a* and 411*b* may include any suitable metal, such as Tungsten (W). Each of metal pads 411*a* and 411*b* may be connected to a transistor. For example, each of metal pads 411*a* and 411*b* may be metal pad 321*c* of FIG. 3A or metal pad 322*c* of FIG. 3B that is connected to drain region 303*c* of transistor 303. As another example, each of metal pads 411*a* and 411*b* may be metal via 311*c* of FIG. 3A.

Figure 4B:
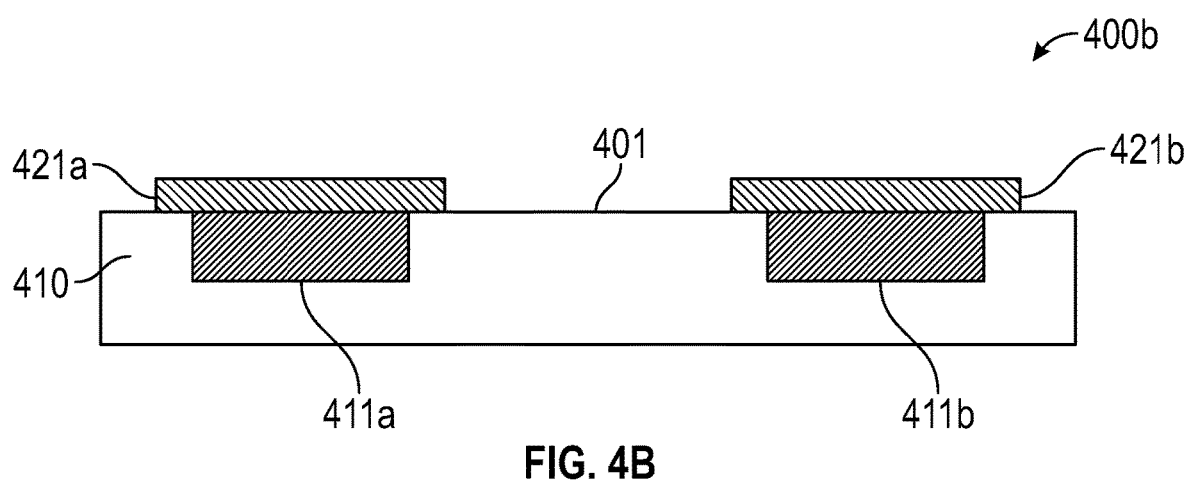

As shown in FIG. 4B, a first bottom electrode 421*a* and a second bottom electrode 421*b* may be fabricated on metal pad 411*a* and metal pad 411*b*, respectively. As shown, the lateral dimension of bottom electrode 421*a*-*b* may be greater than that of metal pads 411*a*-*b*. First bottom electrode 421*a* may directly contact metal pad 411*a* to form an ohmic contact. Second bottom electrode 421*b* may directly contact the second metal pad 411*b* to form an ohmic contact. First bottom electrode 421*a* and second bottom electrode 421*b* may further contact one or more portions of substrate 410, such as one or more portions of a surface 401 of the substrate 410. First bottom electrode 421*a* and/or second bottom electrode 421*b* may include any suitable material that is electronically conductive and non-reactive to the switching oxide of the RRAM devices to be fabricated on substrate 410. Examples of the non-reactive materials may include platinum (Pt), palladium (Pd), iridium (Ir), titanium nitride (TiN), tantalum nitride (TaN), etc. In some embodiments, first bottom electrode 421*a* and/or second bottom electrode 421*b* may include one or more metals that may enhance adhesion between first bottom electrode 421*a* and metal pad 411*a*, adhesion of second bottom electrode 421*b* to second metal pad 411*b*, and/or adhesion of first bottom electrode 421*a* and second bottom electrode 421*b* to substrate 410, such as tantalum (Ta), Titanium (Ti), etc.

Figure 4C:
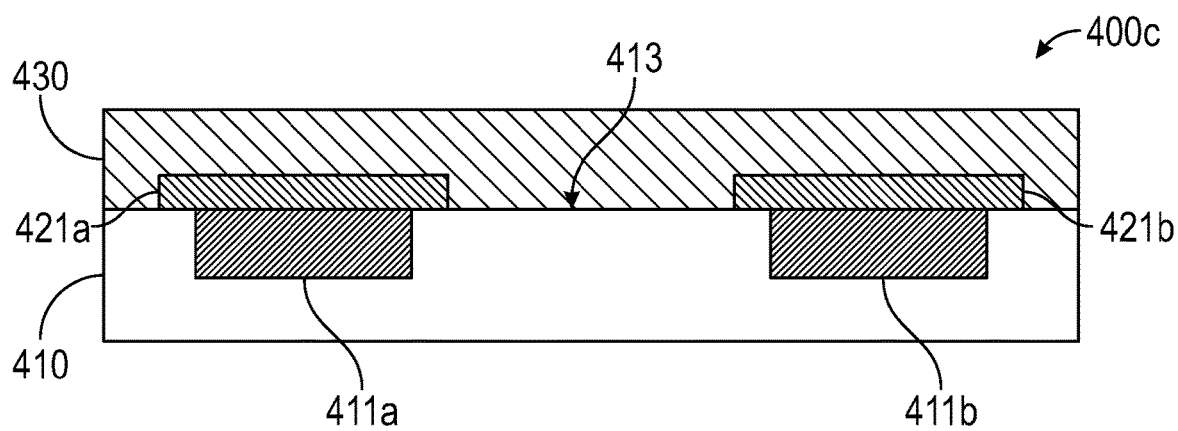

As shown in FIG. 4C, a first etch stop layer 430 may be fabricated on substrate 410, first bottom electrode 421*a*, and second bottom electrode 421*b*. In some implementations, first etch stop layer 430 may directly contact top surface 401 of substrate 410, first bottom electrode 421*a*, and second bottom electrode 421*b*. First etch stop layer 430 may include any suitable material that may be resistant to an etch process performed on a dielectric layer described herein (e.g., a layer of $SiO_2$). For example, first etch stop layer 430 may include one or more layers of silicon nitride ($SiN_x$), silicon oxynitride ($SiO_xN_y$), etc.

Figure 4D:
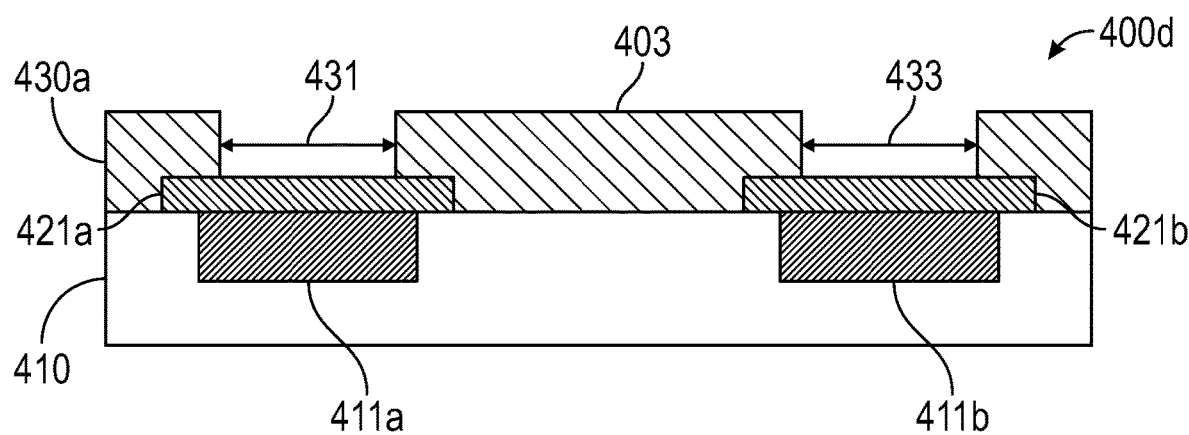

As shown in FIG. 4D, one or more portions of first etch stop layer 430 may be selectively removed to expose a portion of each bottom electrode fabricated on substrate 410 (e.g., utilizing suitable lithography techniques). For example, first etch stop layer 430 may be patterned and etched. The etching of first etch stop layer 430 may stop on first bottom electrode 421*a* and second bottom electrode 421*b*. The selective removal of the portion(s) of first etch stop layer 430 may expose one or more portions of first bottom electrode 421*a* and second bottom electrode 421*b* and may create vias 431 and 433 in the etched first etch stop layer 430 (also referred to as etch stop layer 430*a*). As shown, the via bottom of via 431 may directly contact the exposed portion of first bottom electrode 421*a*. Similarly, the via bottom of via 433 may directly contact the exposed portion of second bottom electrode 421*b*. In some embodiments, a dimension (e.g., a diameter) of vias 431 and/or 433 may be about or less than 1 μm. The lateral dimension of bottom electrodes 421*a*-*b* and the lateral dimension of metal pads 411*a*-*b* may be greater than the dimension of vias 431 and/or 433.

Figure 4E:
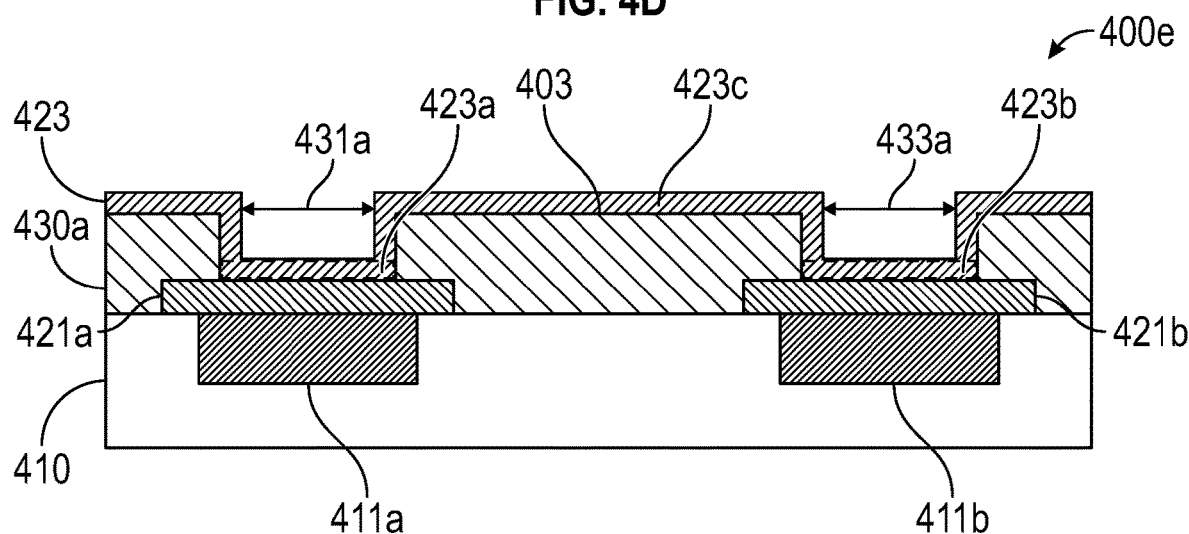

Referring to FIG. 4E, a switching oxide layer 423 may be fabricated on etch stop layer 430*a* and in vias 431 and 433. Switching oxide layer 423 may include one or more switching metal oxides, such as $TaO_x$, $HfO_x$, $TiO_x$, $NbO_x$, $ZrO_x$, etc., in binary oxides, ternary oxides, and high order oxides, wherein x may be used to indicate the oxide being oxygen deficient compared to its full (or terminal) oxide and the value of x may be varied from the oxygen to metal atomic ratio in the stoichiometry of its full oxide, such as $x \leq 2.0$ for $HfO_x$ (where $HfO_2$ being the full oxide), and $x \leq 2.5$ for $TaO_x$ (where $Ta_2O_5$ being the full oxide). Switching oxide layer 423 may be conformally fabricated on top surface 403 of etch stop layer 430*a* and the exposed portions of first bottom electrode 421*a* and second bottom electrode 421*b*, and along the sidewalls of vias 431 and 433. In some embodiments, switching oxide layer 423 may be fabricated over the entire surface 403 of etch stop layer 430*a*. As shown, portions 423*a* and 423*b* of switching oxide layer 423 are fabricated on the exposed portion of first bottom electrode 421*a* in via 431 and the exposed portion of second bottom electrode 421*b* in via 433, respectively. The fabrication of switching oxide layer 423 may create vias 431*a* and 433*a* that correspond to the portions of vias 431 and 433 that are not filled by switching oxide layer 423, respectively.

Figure 4F:
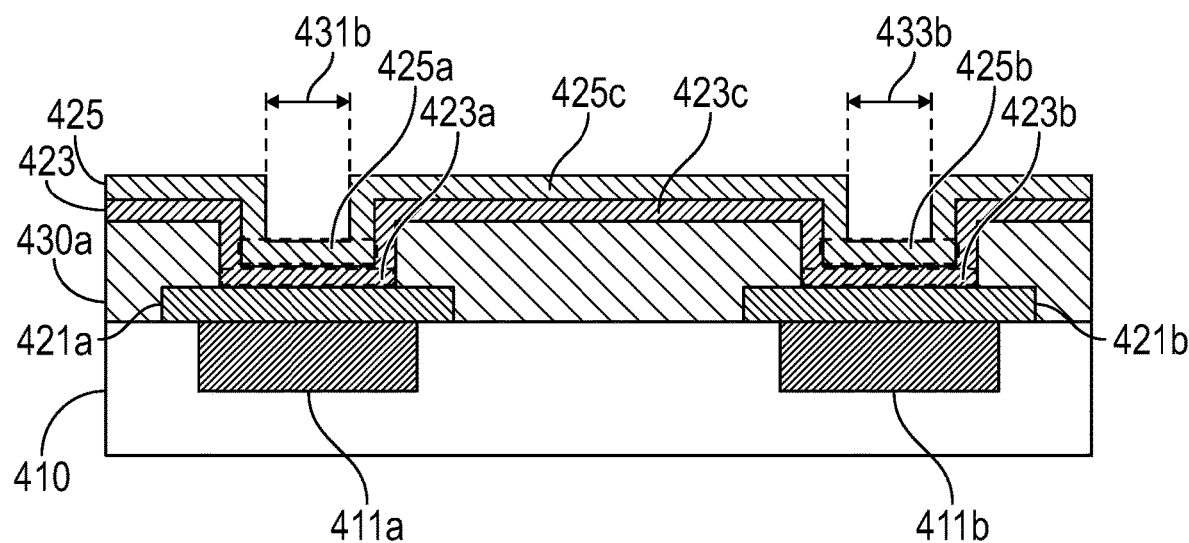

Referring to FIG. 4F, a top electrode layer 425 may be fabricated on switching oxide layer 423. The top electrode layer 425 may include any suitable metallic material that are electronically conductive and reactive to the transition metal oxide in switching oxide layer 423. For example, top electrode layer 425 may include one or more of Ta, Hf, Ti, TiN, TaN, and the like. As illustrated in FIG. 4F, top electrode layer 425 may include a portion 425*a* that is fabricated on portion 423*a* of switching oxide layer 423 and a portion 425*b* that is fabricated on portion 423*b* of switching oxide layer 423. The formation of portions 425*a* and 425*b* of top electrode layer 425 may create vias 431*b* and 433*b*, which correspond to the unfilled portions of vias 431*a* and 433*a*, respectively. A portion 425*c* of the top electrode layer 425 may be formed on a top surface of the portion 423*c* of the switching oxide layer 423. As such, the top electrode layer 425 may be conformally fabricated on the top surface of the switching oxide layer 423 and along the sidewalls of vias 431a and 431b.

Figure 4G:
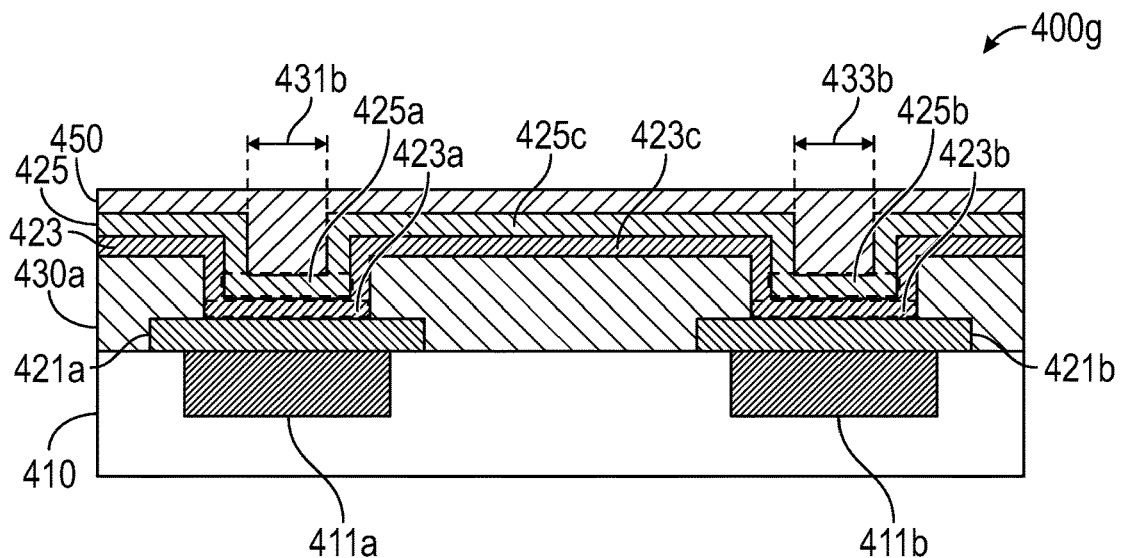

Referring to FIG. 4G, a second etch stop layer 450 may be fabricated on top electrode layer 425. Second etch stop layer 450 may include any suitable material that may be resistant to an etch process performed on a dielectric layer as described herein. For example, etch stop layer 450 may include one or more layers of $SiN_x$, $SiO_xN_y$, etc. As shown in FIG. 4G, second etch stop layer 450 may be fabricated on the top surface of top electrode layer 425 and in vias 431b and 433b. Second etch stop layer 450 may fill vias 431b and 433b and may extend beyond vias 431b and 433b.

Figure 4H:
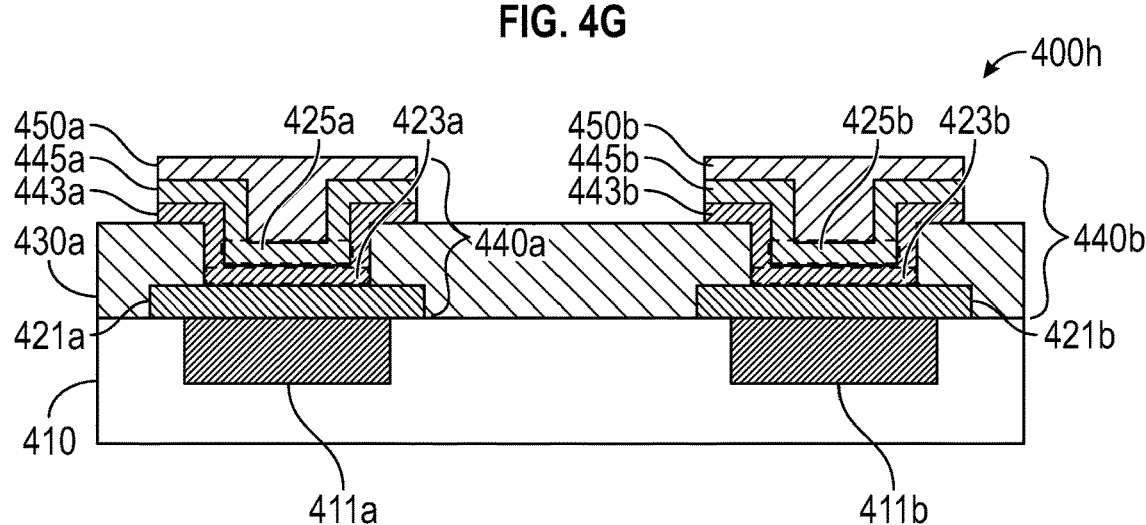

Referring to FIG. 4H, second etch stop layer 450 and top electrode layer 425 may be selectively etched to fabricate RRAM devices 440a and 440b (e.g., utilizing suitable lithography techniques). In particular, second etch stop layer 450 is patterned. Second etch stop layer 450 and top electrode layer 425 may be etched to form etch stop layers 450a-450b, a top electrode 445a of a first RRAM device 440a, and a top electrode 445b of a second RRAM device 440b. Second etch stop layer 450 may function as etch masks during the etching of top electrode layer 425. The etching of second etch stop layer 450 and top electrode layer 425 may stop on switching oxide layer 423 as second etch stop layer 450 may enable the etching of silicon nitride and metals over switching metal oxides with a high selectivity.

In one implementation, switching oxide layer 423 may also be selectively etched to fabricate a filament-forming layer 443a of RRAM device 440a and a filament-forming layer 443b of RRAM device 440b. In another implementation, switching oxide layer 423 is not etched during the fabrication of RRAM devices 440a and 440b and may function as filament-forming layers 443a and 443b. The fabrication of filament-forming layers 443a and 443b may expose one or more portions of etch stop layer 430a.

More particularly, the portion 425c of top electrode layer 425 may be selectively etched to fabricate first top electrode 445a and second top electrode 445b. The portion 423c of switching oxide layer 423 may be selectively etched to fabricate first filament-forming layer 443a and second filament-forming layer 443b. During the etching of top electrode layer 425 and/or switching oxide layer 423, the portions 423a and 423b of switching oxide layer 423 are not etched or otherwise modified. As will be discussed in greater detail below, each of the portions 423a and 423b of switching oxide layer 423 may serve as a filament-forming region in which a filament may form in response to a suitable voltage applied to the RRAM device. The fabrication of filament-forming layers 443a and 443b without etching the portions 423a and 423b of switching oxide layer 423 may avoid device degradation resulting from the etching process. For example, the etching of top electrode layer 425 during the fabrication of the RRAM device(s) may cause redeposition of the etched top electrode material on the portion 423c of switching oxide layer 423. However, this does not result in performance deterioration of the RRAM device(s) to be fabricated given that the portion 423c of switching oxide layer 423 is not the filament-forming region of the RRAM device and that the filament-forming regions 423a-b are not exposed and affected by the etching process.

Figure 4I:
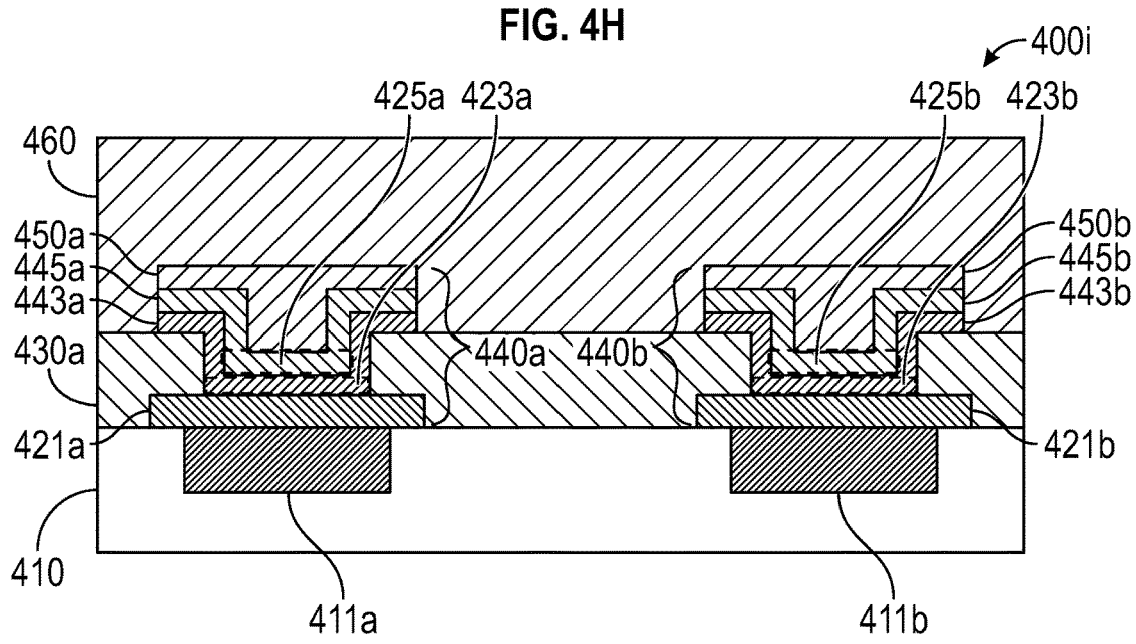

Referring to FIG. 4I, a dielectric layer 460 may be fabricated on etch stop layers 450a-b and the exposed portions of etch stop layer 430a. Dielectric layer 460 may include any suitable dielectric material, such as silicon dioxide ($SiO_2$), etc. In some embodiments in which switching oxide layer 423 is not etched to fabricate filament-forming layers 443a and 443b, dielectric layer 460 may be fabricated on etch stop layers 450a-b and switching oxide layer 423.

Figure 4J:
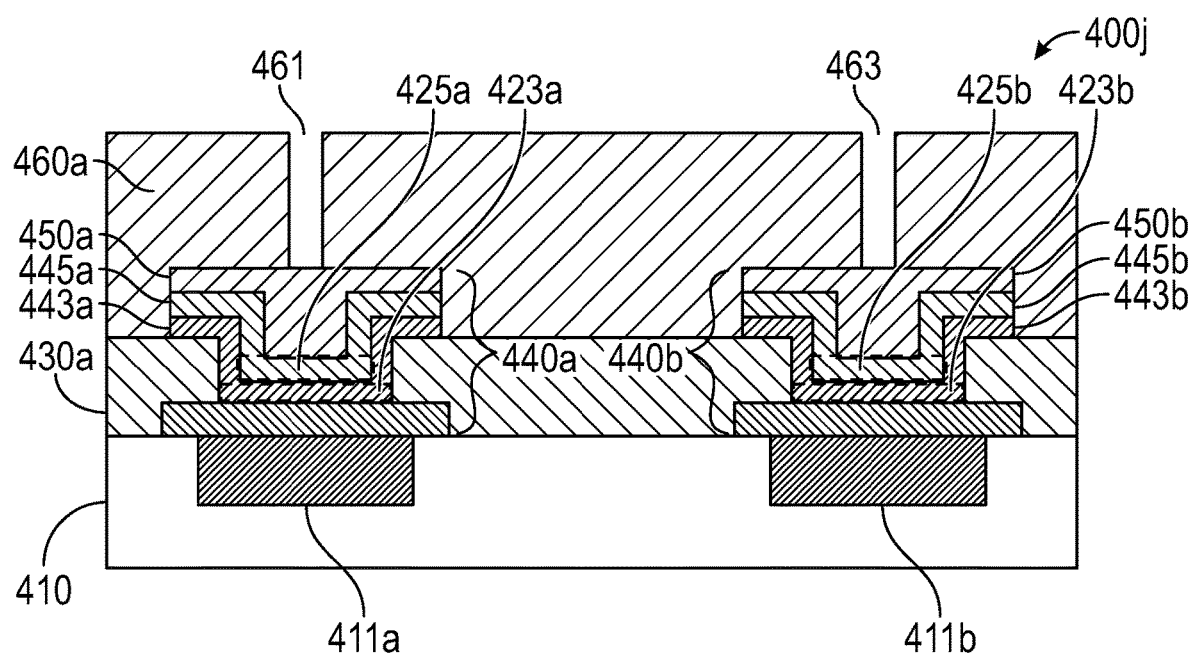

Referring to FIG. 4J, dielectric layer 460 may be selectively removed to fabricate via trenches 461 and 463. For example, dielectric layer 460 may be patterned and etched to form via trenches 461 and 463. As etch stop layers 450a-b and 430a are resistant to the etching of dielectric layer 460, the etching of dielectric layer 460 may stop on etch stop layers 450a-b. As such, etch stop layer 450a-b may enable highly selective etching of dielectric layer 460 and may protect first top electrode 445a and second top electrode 445b during the etching of dielectric layer 460. The etching of dielectric layer 460 may be regarded as stopping on an etch stop layer when the entire etch stop layer or a substantial portion of the etch stop layer is not etched during the etching of dielectric layer 460.

Figure 4K:
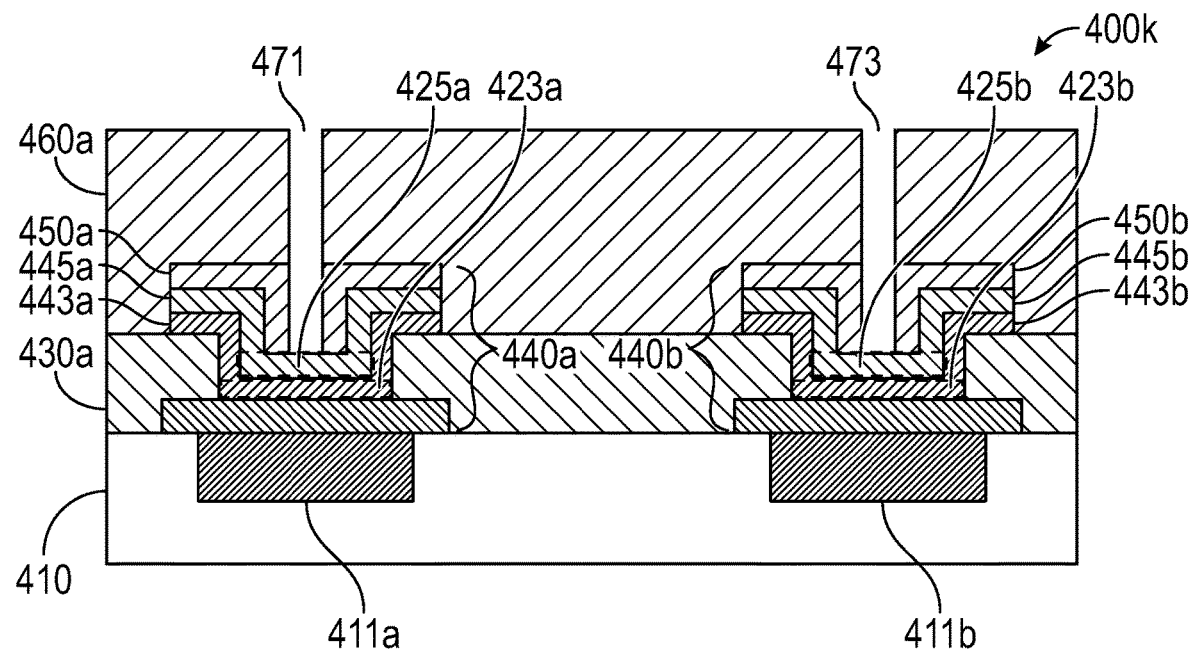

Referring to FIG. 4K, one or more portions of etch stop layers 450a-b are selectively removed to expand via trenches 461 and 463 and to create via trenches 471 and 473. The via bottom of via trenches 471 and 473 may contact first top electrode 445a (e.g., the portion 425a of first top electrode 445a) and second top electrode 445b (e.g., the portion 425b of second top electrode 445b), respectively. More particularly, for example, etch stop layer 450a may be patterned and etched to fabricate the bottom portion (the second portion) of via trench 471. Etch stop layer 450b may be patterned and etched to fabricate the bottom portion (the second portion) of via trench 473. The etching of etch stop layers 450a-b may stop on the top electrode 445a-b, respectively, due to a high selectivity between the etch of the etch stop layer and the metal.

Figure 4L:
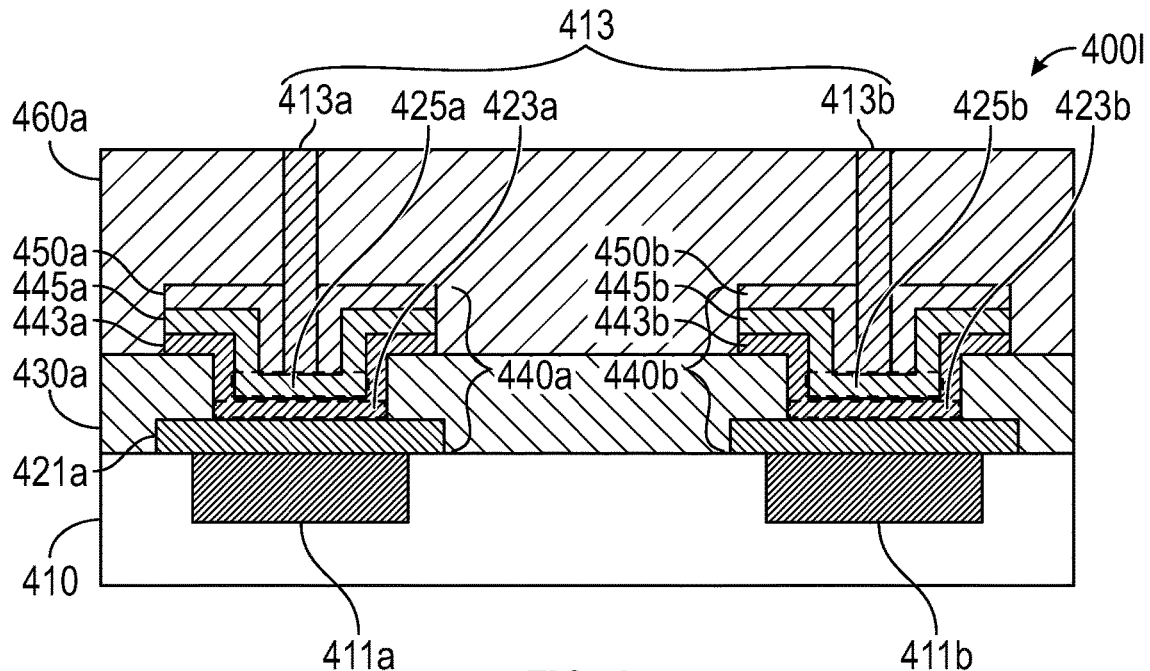
Figure 4M:
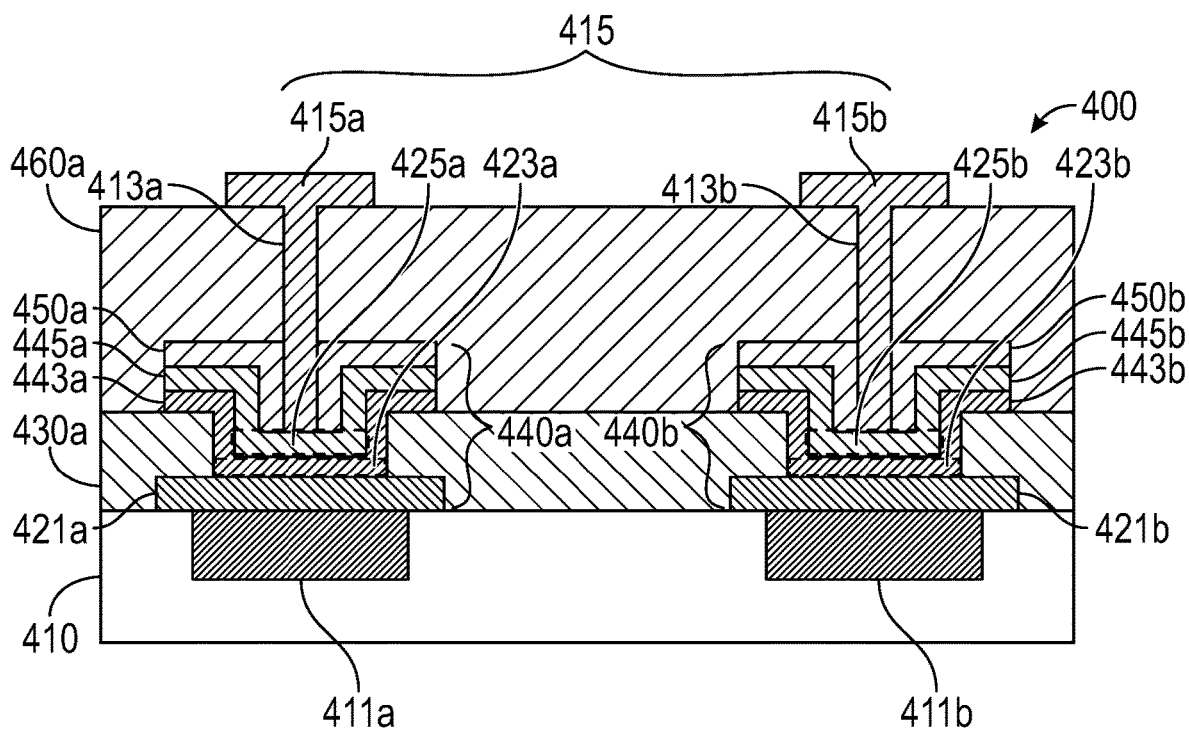

As shown FIG. 4L, metal vias 413a and 413b of a second interconnect layer 413 may be fabricated by depositing suitable metals in via trenches 471 and 473. In some embodiments, as shown in FIG. 4M, a third interconnect layer 415 may be fabricated on third interconnect layer 413. Third interconnect layer may include metal pads 415a and 415b may be fabricated on metal vias 413a and 413b, respectively. In some embodiments, metal vias 413a-b and metal pads 415a-b may be fabricated utilizing a dual-damascene fabrication process (e.g., process 900 of FIG. 9A) in which metal vias and metal pads may be fabricated during the same metal deposition and patterning process.

As illustrated in FIG. 4M, semiconductor device 400 may include first RRAM device 440a and second RRAM device 440b that are fabricated on metal pads 411a and 411b of first interconnect layer 411, respectively. The first RRAM device 440a may include first bottom electrode 421a, first top electrode 445a, and first filament-forming layer 443a fabricated between first bottom electrode 421a and first top electrode 445a. Second RRAM device 440b may include second bottom electrode 421b, second top electrode 445b, and second filament-forming layer 443b fabricated between second bottom electrode 421b and second top electrode 445b. First filament-forming region 423a and at least a portion 425a of first top electrode 445a are fabricated in via 431 (also referred to as the "first via"). Second filament-forming region 423b and at least a portion 425b of second top electrode 445b are fabricated in via 433 (also referred to as the "second via"). In some embodiments, RRAM devices 440a and/or 440b may include one or more interface layers, diffusion barriers, and adhesion layers as described in connection with FIGS. 6A-6E.

Metal via 413a of second interconnect layer 413 may be fabricated in via trench 471 which is positioned in dielectric layer 460a and etch stop layer 450a. Metal via 413b of second interconnect layer 413 may be fabricated in via trench 473 which is positioned in dielectric layer 460a and etch stop layer 450b. Metal vias 413a and 413b may directly contact first top electrode 445a and second top electrode 445b, respectively.

A conductive filament may form in the portion 423a of switching oxide layer 423 (also referred to as the "first filament-forming region 423a") when a suitable programming signal (e.g., a set voltage, a reset voltage, etc.) is applied to first top electrode 445a and first bottom electrode 421a. Similarly, a conductive filament may form in the portion 423b of switching oxide layer 423 (also referred to as the "filament-forming region 423b") when a suitable programming signal is applied to second top electrode 445b and second bottom electrode 421b. For example, each of RRAM device 440a-b may have an initial resistance after it is fabricated. The initial resistance of RRAM device 440a-b may be changed, and RRAM device 440a-b may be switched to a state of a lower resistance via a forming process. During the forming process, a suitable voltage or current signal may be applied to RRAM device 440a-b. The application of the voltage or current signal to RRAM device 400a-b may induce the metallic material(s) in top electrode 445a-b to absorb oxygen from filament-forming regions 423a-b and create oxygen vacancies in the filament-forming region 423a-b. As a result, a conductive channel (e.g., a filament) which is oxygen vacancy rich may form in filament-forming region 423a-b. The portions of the filament-forming layer 445a-b that do not contact bottom electrodes 421a-b are not subject to an electric field during the forming process. Only the filament-forming regions 423a-b of the filament forming layer 423 that contact the bottom electric is between the top electrode and the bottom electrode and is subject to an electric field during the operation of the RRAM device 440a-b. The RRAM device 440a-b may be reset to a high-resistance state by applying a reset signal (e.g., a voltage signal or a current signal) to the RRAM device 440a-b. The application of the reset signal may cause oxygen to drift back to the filament-forming region 423a-b of the filament-forming layer 443a-b and recombine with one or more of the oxygen vacancies. For example, an interrupted conductive channel (not shown) may be formed in the filament-forming region 423a-b of the filament-forming layer 443a-b during the reset process. The conductive channel may be interrupted with an oxide gap with poor oxygen vacancies between the interrupted conductive channel and bottom electrode 421a-b. The portion of the filament-forming layer 445a-b that does not contact bottom electrode 421a-b is not subject to an electric field between top electrode 445a-b and bottom electrode 421a-b during the reset process. RRAM device 440a-b may be electrically switched between the high-resistance state and the low-resistance state by applying suitable programming signals (e.g., voltage signals, current signals, etc.) to RRAM device 440a-b.

Figure 5A:
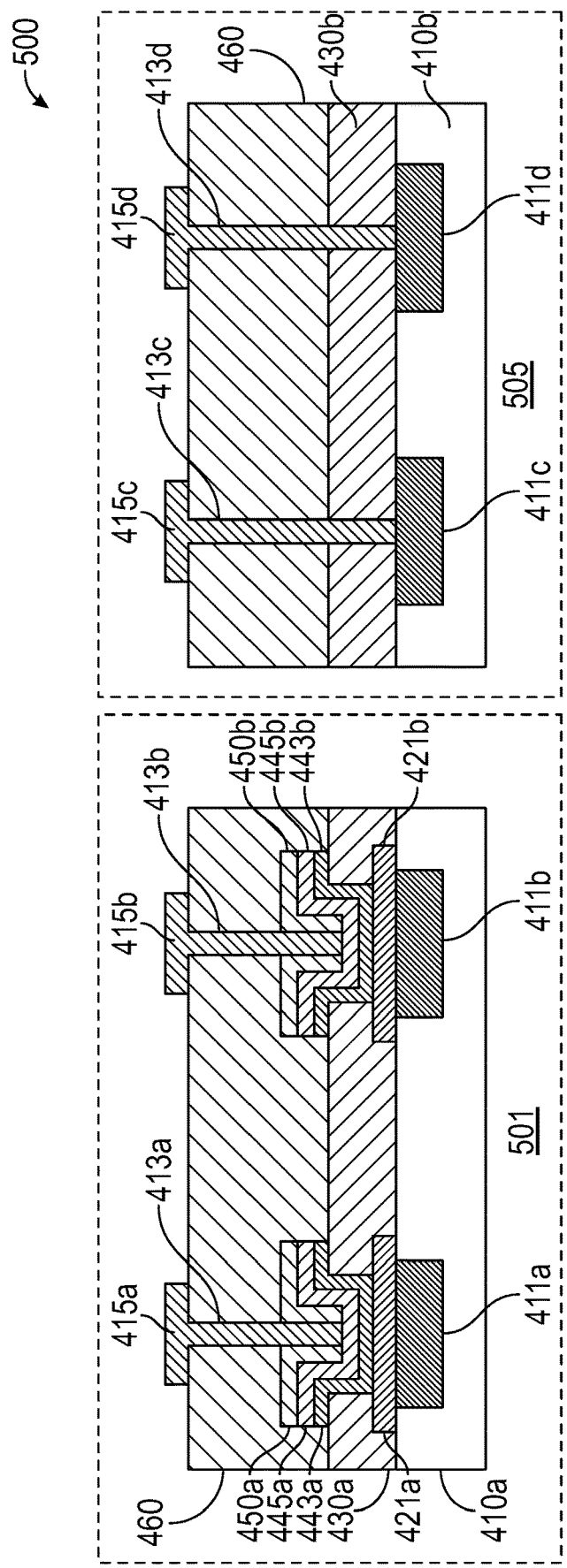
FIG. 5A is a schematic diagram illustrating an example of a crossbar circuit in accordance with some embodiments of the present disclosure.

Etch stop layer 430 may protect the via device structures of RRAM devices 440a-b during the etching of the layers disposed on the RRAM devices. Etch stop layer 450 may protect the top electrodes of RRAM devices 440a-b during the etching of the layers disposed on the RRAM devices. Etch stop layers 430 and 450 may enable high etching selectivity during the fabrication of RRAM devices 440a-b. The etch stop layers may function as etching masks in some of the etching processes described herein and may thus reduce manufacturing costs. Etch stop layers 430 and 450 may also function as a barrier or a spacer to isolate the oxygen diffusion from the dielectric materials to the RRAM devices for better device uniformity and device operation control. The mechanisms for fabricating the crossbar circuit as described herein may enable the fabrication of RRAM devices without using spacers during the etching processes FIG. 5A is a schematic diagram illustrating an example 500 of a crossbar circuit in accordance with some embodiments of the present disclosure. Crossbar circuit 500 may include a crossbar array 501 and a periphery circuit 505. Crossbar array 501 may include one or more arrays of cross-point devices as described herein. Crossbar array 501 may include semiconductor device 400. Periphery circuit 505 does not include a cross-point device and/or an RRAM device as described herein. Periphery circuit 505 may include one or more transistors (not shown) for implementing logic circuits. Periphery circuit 505 and crossbar array 501 may be fabricated on the same substrate 410 as described in connection with FIG. 4A. The portion of substrate 410 on which crossbar array 501 is fabricated is referred to herein as substrate 410a. The portion of substrate 410 on which periphery circuit 505 is fabricated is referred to as substrate 410b.

As illustrated in FIG. 5A, a portion of first etch stop layer 430 (referred to as "etch stop layer 430b") may be fabricated on substrate 410b and the portion of first interconnect layer 411 that is fabricated on substrate 410b (e.g., metal pads 411c-d, etc.). A portion of dielectric layer 460 is fabricated on etch stop layer 430b. Periphery circuit 505 does not include a second etch stop layer fabricated between etch stop layer 430b and dielectric layer 460.

Periphery circuit 505 may include metal pads 411c and 411d of first interconnect layer 411 and metal vias 413c and 413d of second interconnect layer 413. In some embodiments, periphery circuit 505 may further include metal pads 415c and 415d of third interconnect layer 415. Metal via 413c may connect metal pads 415c and 411c. Metal via 413d may connect metal pads 415d and 411d. In some embodiments, metal via 413c and 413d may directly contact metal pads 411c and 411d, respectively. As shown, metal vias 413c and 413d are fabricated in via trenches positioned in dielectric layer 460 and first etch stop layer 430b.

FIGS. 5B-5L are diagrams illustrating cross-sectional views of structures for fabricating crossbar circuit 500 in accordance with some embodiments of the present disclosure.

Figure 5B:
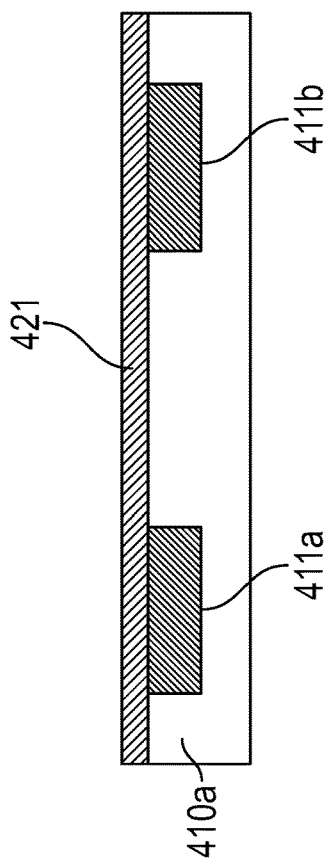
Figure 5B:
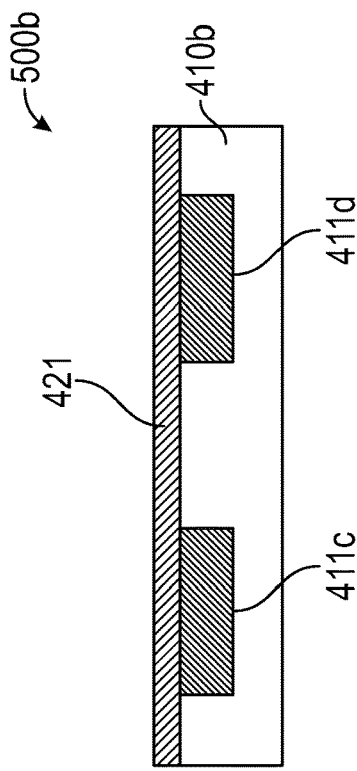
Figure 5C:
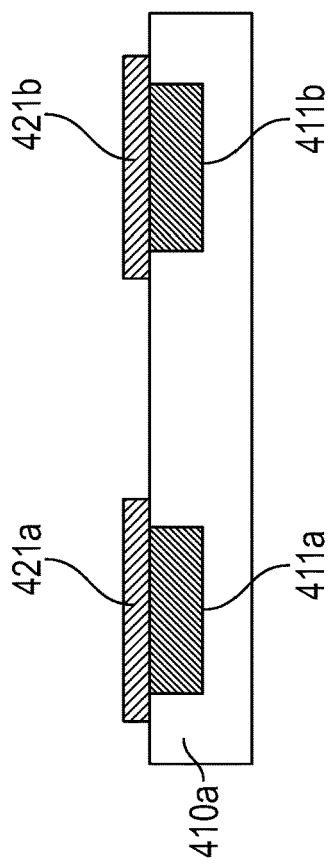
Figure 5C:
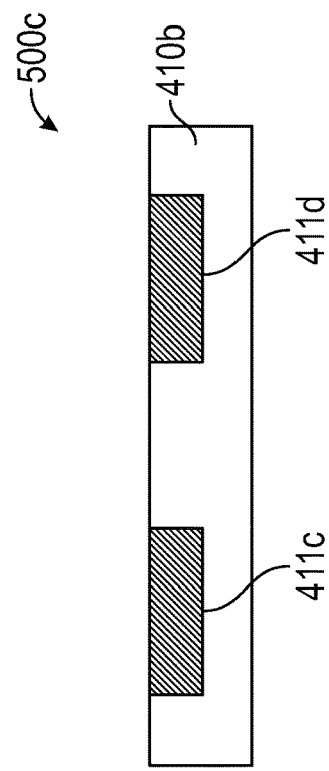

As shown in FIG. 5B, a bottom electrode layer 421 may be deposited on first interconnect layer 411 and substrate 410a-b. Bottom electrode layer 421 may be patterned and etched to fabricate first bottom electrode 421a and second bottom electrode 421b. For example, as shown in FIG. 5C, the portion of bottom electrode layer 421 deposited on substrate 410b is removed during the etching of bottom electrode layer 421. As such, the etching of bottom electrode layer 421 does not fabricate a bottom electrode on metal pads 411c-d or substrate 410b.

Figure 5D:
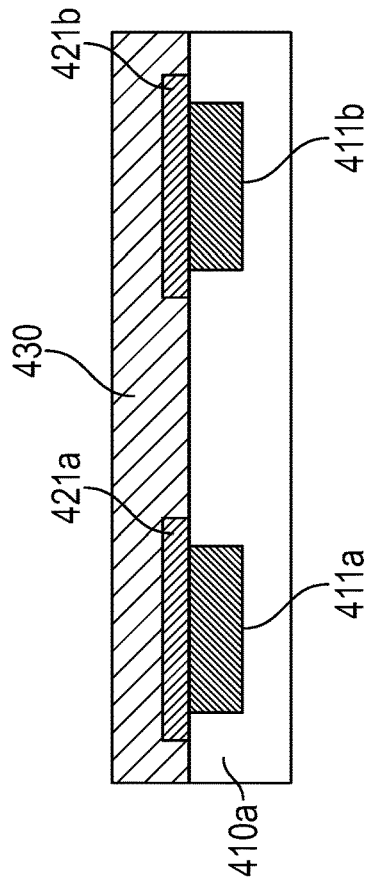
Figure 5D:
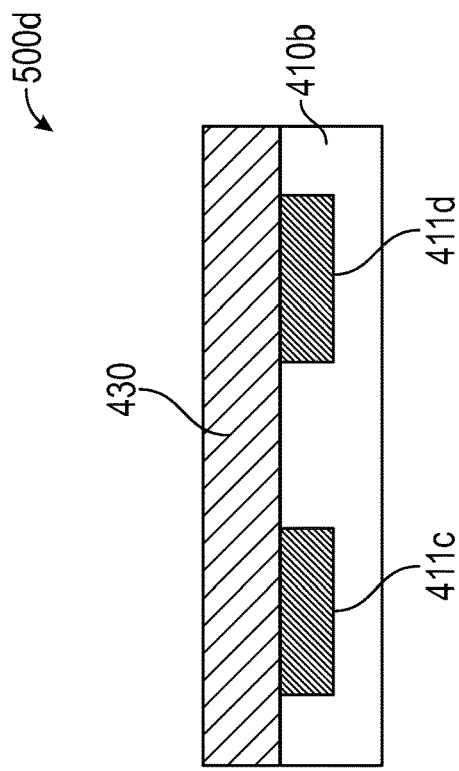
Figure 5E:
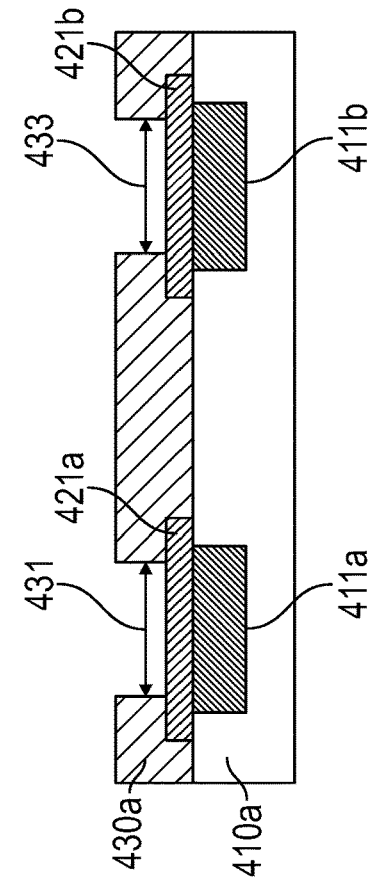
Figure 5E:
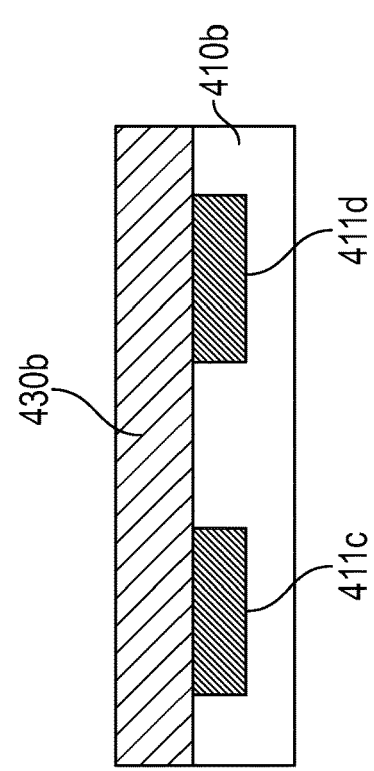

Referring to FIG. 5D, first etch stop layer 430 may be fabricated on first bottom electrode 421a, second bottom electrode 421b, metal pads 411c and 411d, and the top surface of substrate 410. First etch stop layer 430 may be fabricated over the entire surface of substrate 410a-b. Referring to FIG. 5E, one or more portions of first etch stop layer 430 may be selectively removed to expose a portion of first bottom electrode 421a and a portion of second bottom electrode 421b. For example, first etch stop layer 430 may be patterned and etched to fabricate vias 431 and 433. The portion of first etch stop layer 430 that is deposited on substrate 410b is not patterned. As shown in FIG. 5E, no via is created in etch stop layer 430b.

Figure 5F:
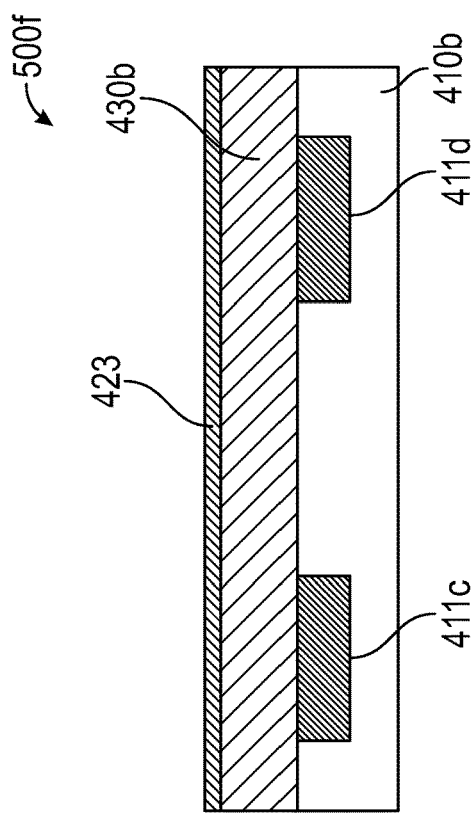
Figure 5F:
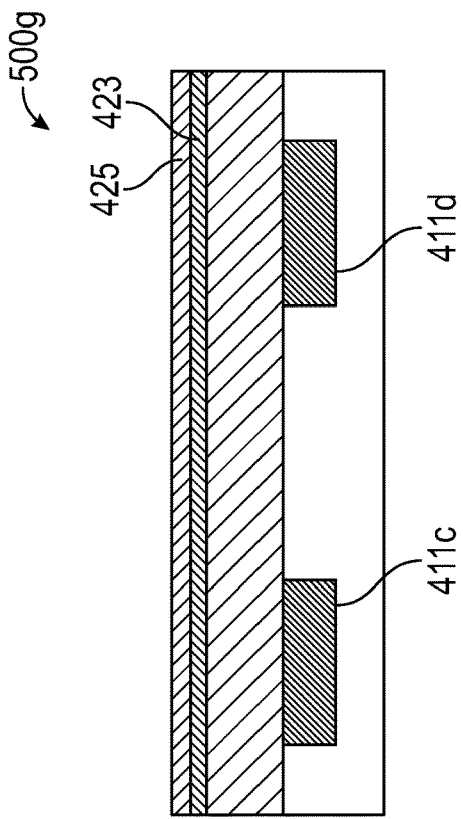
Figure 5F:
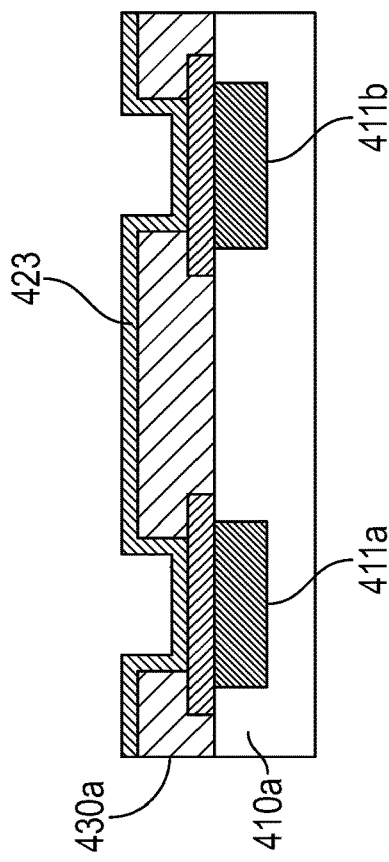
Figure 5G:
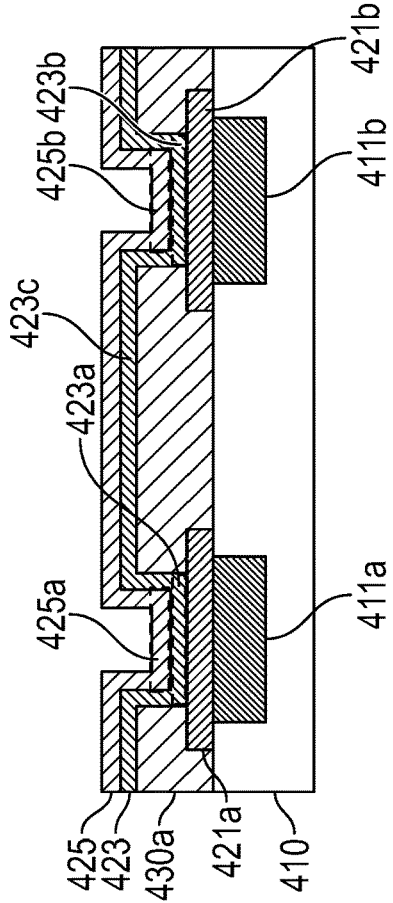
Figure 5H:
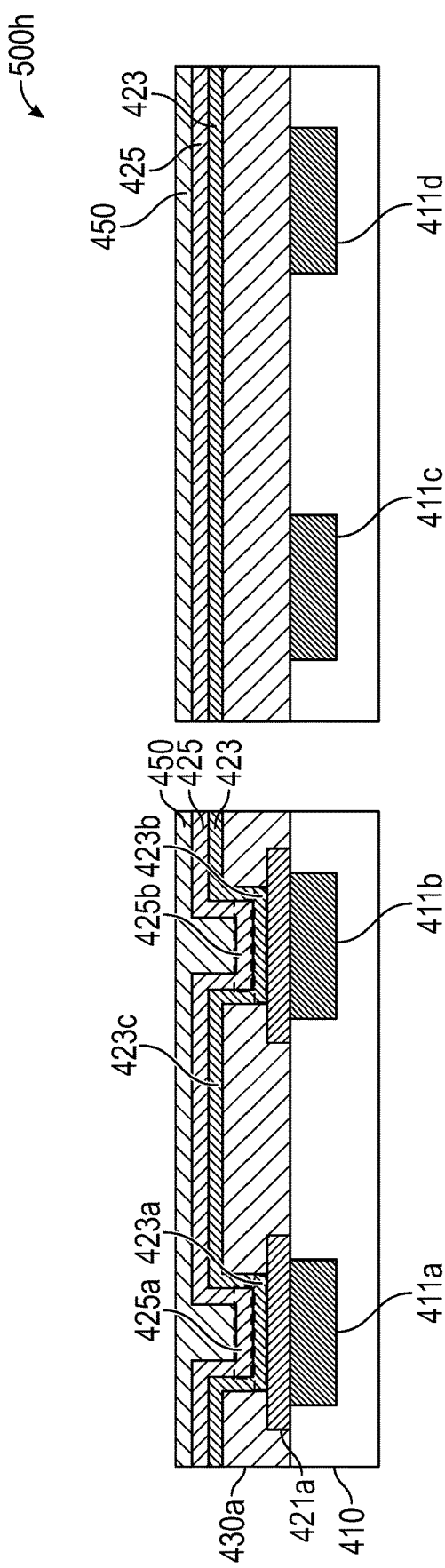

Referring to FIG. 5F, switching oxide layer 423 may be fabricated on etch stop layers 430a-b and in vias 431 and 433. As shown in FIG. 5G, top electrode layer 425 may be fabricated on switching oxide layer 423. Second etch stop layer 450 may then be fabricated on top electrode layer 425 as shown in FIG. 5H.

Figure 5I:
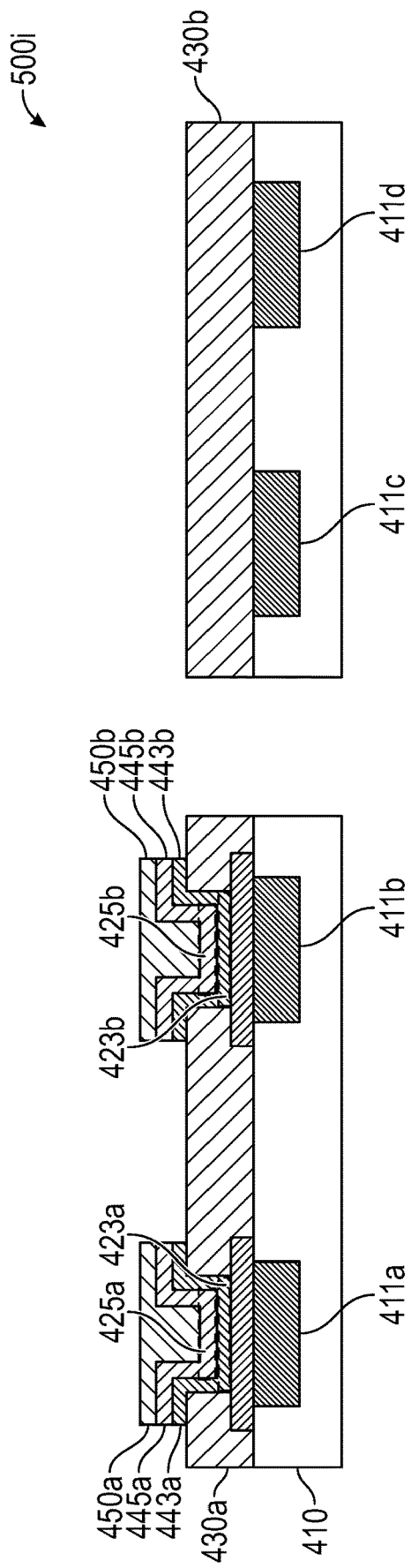

As illustrated in FIG. 5I, second etch stop layer 450 and top electrode layer 425 may be selectively etched to fabricate RRAM device 440a and 440b as described in connection with FIG. 4M above. The etch process may involve patterning and etching second etch stop layer 450. The etching of second etch stop layer 450 may be stopped on top electrode layer 425. Top electrode layer 425 and switching oxide layer 423 may then be patterned and etched. The etching of top electrode layer 425 and switching oxide layer 423 may be stopped on etch stop layer 430. More particularly, for example, the etching of top electrode layer 425 may remove the portions of top electrode layer 425 deposited on etch stop layer 430b. The etching of switching oxide layer 423 may fabricate filament-forming layers 443a and 443b. The etching of switching oxide layer 423 may remove the portion of switching oxide layer 423 deposited on etch stop layer 430b. As such, the portions of second etch stop layer 450, top electrode layer 425, and switching oxide layer 423 that are deposited on etch stop layer 430b may be removed during the fabrication of RRAM devices 440a and 440b.

As shown in FIG. 5J, dielectric layer 460 may be fabricated on etch stop layers 450a, 450b, 430a, and 430b. As shown in FIG. 5K, via trenches 461, 463, 465, and 467 may be fabricated in dielectric layer 460 by patterning and etching dielectric layer 460. The etching of dielectric layer 460 may stop on etch stop layers 450a, 450b, and/or 430b. For example, the fabrication of via trenches 461 and 463 may expose a portion of etch stop layer 450a and a portion of etch stop layer 450b, respectively. The fabrication of via trenches 465 and 467 may expose one or more portions of etch stop layer 430b. As shown in FIG. 5L, etch stop layers 450a, 450b, and 430b may be patterned and etched to extend via trenches 461, 463, 465, and 467 and fabricate via trenches 471, 473, 475, and 477. Via trenches 461, 463, 465, and 467 may be regarded as being the first portions of via trenches 471, 473, 475, and 477, respectively. The etching of etch stop layers 450a and 450b may stop on top electrodes 445a and 445b, respectively. The patterning and etching of etch stop layer 450a may extend via trench 461 and may create the bottom portion (second portion) of via trench 471. The etching of etch stop layer 430b may stop on interconnect layer 411. More particularly, the patterning and etching of etch stop layer 430b may extend via trenches 465 and 467 and create the bottom portion (the second portion) of via trenches 475 and 477, respectively. The fabrication of via trenches 475 and 477 may expose a portion of metal pad 411c and a portion of metal pad 411d, respectively.

The etch stop layers described herein may protect the via device structures during the etching of the dielectric layer and fabrication of the periphery circuit and may enable high etching selectivity during the etching of the dielectric layer. The mechanisms for fabricating the crossbar circuit as described herein may enable the fabrication of RRAM devices without using spacers during the etching processes and may facilitate integration of the RRAM fabrication into the lower metal interconnects in CMOS flow.

Referring to FIG. 5M, suitable metallic materials (e.g., Cu, W, etc.) may be deposited in via trenches 471, 473, 475, and 477 to fabricate metal vias 413a, 413b, 413c, and 413d, respectively. Metal vias 413c and 413d may contact metal pads 411c and 411d, respectively. Referring to FIG. 5A, metal pads 415a, 415b, 415c, and 415d of third interconnect layer 415 may be fabricated on metal vias 413a, 413b, 413c, and 413d, respectively. In some embodiments, metal vias 413a-b and metal pads 415a-b may be fabricated utilizing a dual-damascene fabrication process (e.g., process 900 of FIG. 9A) in which metal vias and metal pads may be fabricated during the same metal deposition and patterning process.

FIGS. 6A, 6B, 6C, 6D, and 6E are schematic diagrams illustrating cross-sectional views of example RRAM devices 600a, 600b, 600c, 600d, and 600e in accordance with some embodiments of the present disclosure.

Figure 6A:
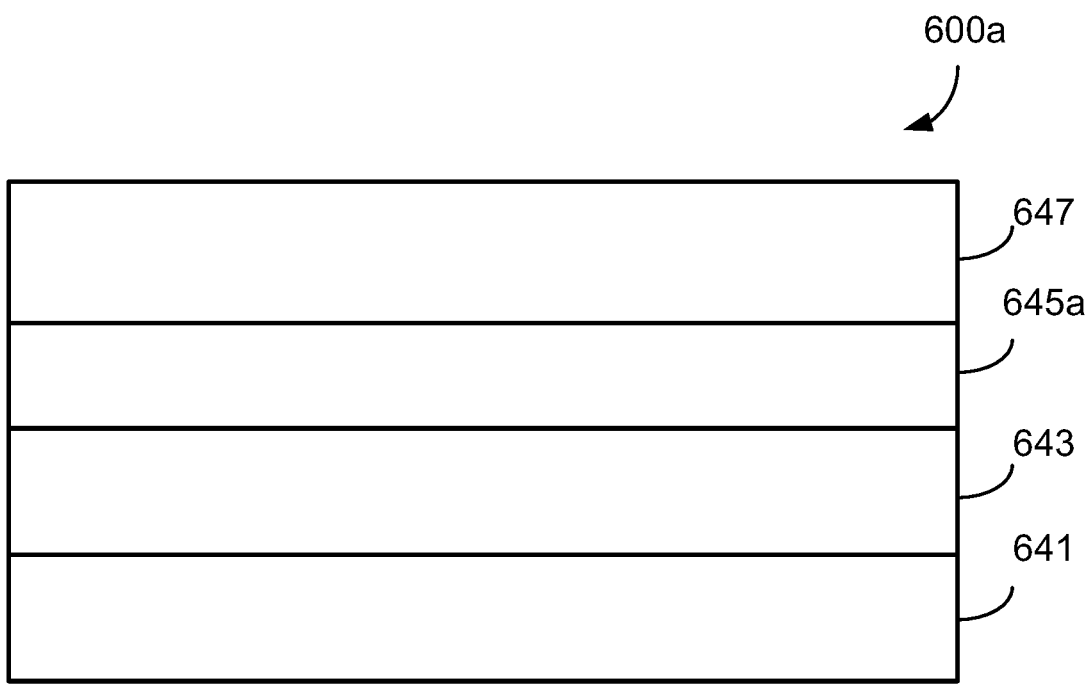
FIGS. 6A, 6B, 6C, 6D, and 6E are schematic diagrams illustrating cross-sectional views of example RRAM devices in accordance with some embodiments of the present disclosure.

As shown in FIG. 6A, RRAM device 600a may include a bottom electrode 641, a switching oxide layer 643, an interface layer 645a, and a top electrode 647. The interface layer 645a (also referred to as the "interface layer A" or the "first interface layer") is fabricated between the top electrode 647 and the switching oxide layer 643.

The switching oxide layer 643 may include one or more transition metal oxides, such as $TaO_x$, $HfO_x$, $TiO_x$, $NbO_x$, $ZrO_x$, etc., in binary oxides, ternary oxides, and high order oxides, wherein x may be used to indicate the oxide being oxygen deficient compared to its full (or terminal) oxide and the value of x may be varied from the oxygen to metal atomic ratio in the stoichiometry of its full oxide, such as $x \leq 2.0$ for $HfO_x$ (where $HfO_2$ being the full oxide), and $x \leq 2.5$ for $TaO_x$ (where $Ta_2O_5$ being the full oxide). As an example, the switching oxide layer 643 may include $Ta_2O_5$. As the other example, the switching oxide layer 643 may include $HfO_2$.

The interface layer 645a may be and/or include a film of a first material that is more chemically stable than the transition metal oxide(s) in the switching oxide layer 643. As a result, the first material may not react with the transition metal oxide(s) of the switching oxide layer 643. As an example, the transition metal oxide(s) of the switching oxide layer may be and/or include one or more transition metal oxides, such as at least one of $HfO_x$ or $TaO_y$, wherein $x \leq 2.0$, and wherein $y \leq 2.5$, and the first material may include $Al_2O_3$, MgO, $Y_2O_3$, $La_2O_3$, etc.

The interface layer 645a may prevent excessive reaction between RRAM switching oxide and the electrodes caused by additional thermal exposure to the RRAM device during the subsequent fabrication of interconnect layers on the RRAM device.

The interface layer 645a may have a suitable thickness to achieve desirable forming gas anneal (FGA) resistance. For example, a relatively thicker interface layer may be more FGA resistant than a relatively thinner interface layer. In one implementation, the interface layer 645a may include a discontinuous film of $Al_2O_3$, $SiO_2$, $Y_2O_3$, etc. In another implementation, the interface layer 645a may include a continuous film of $Al_2O_3$, $SiO_2$, $Y_2O_3$, $La_2O_3$, etc.

Figure 6B:
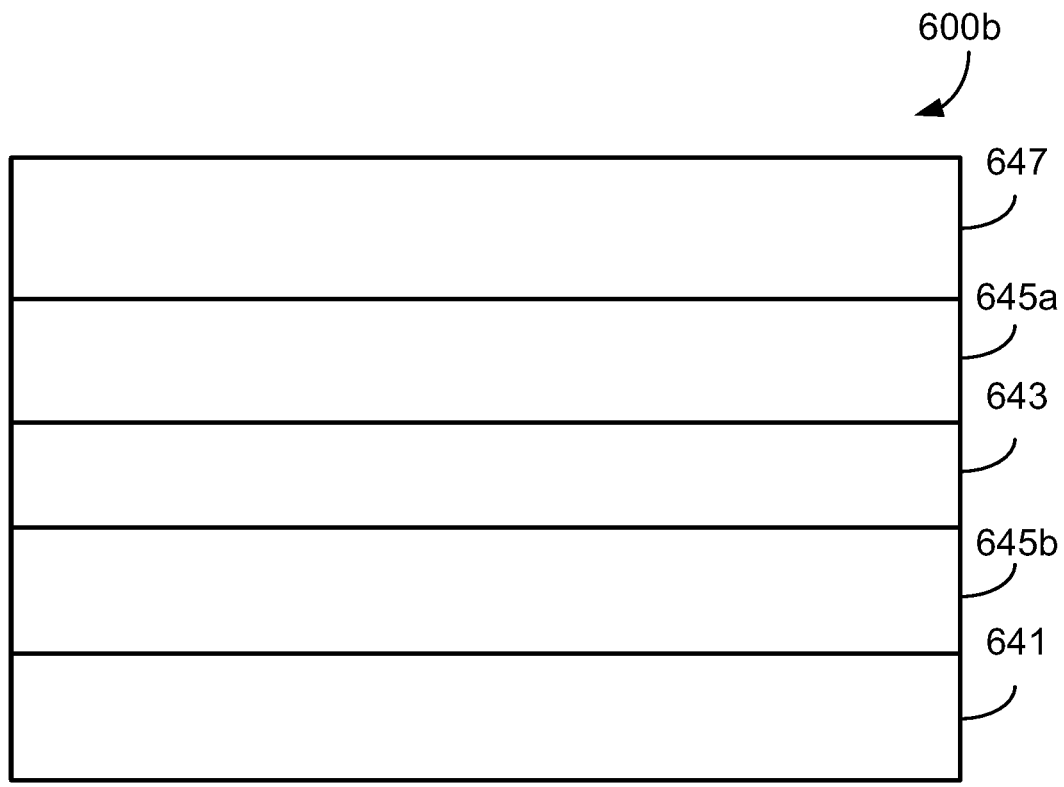

In some embodiments, as illustrated in FIG. 6B, an RRAM 600b device may include multiple interface layers. For example, an interface layer 645b (also referred to as the "interface layer B" or the "second interface layer") may be fabricated between the bottom electrode 641 and the switching oxide layer 643. The interface layer 645b may be and/or include a film of a second material that is more chemically stable than the transition metal oxide(s) in the switching oxide layer 643. As a result, the second material may not react with the transition metal oxide(s) of the switching oxide layer 643. As an example, the transition metal oxide(s) of the switching oxide layer may be and/or include one or more transition metal oxides, such as at least one of $HfO_x$ or $TaO_y$, wherein x≤2.0, and wherein y≤2.5, and the second material may include $Al_2O_3$, MgO, $Y_2O_3$, $La_2O_3$, etc. The first material in the interface layer 645a may or may not be the same as the second material in the interface layer 645b. The interface layer 645b may also be useful where a metal nitride is used as one of the bottom electrode or the top electrode.

The interface layer 645b may have a desired thickness to achieve desirable FGA resistance. For example, a relatively thicker interface layer may be more FGA resistant than a relatively thinner interface layer. In one implementation, the interface layer 645b may include a discontinuous film of $Al_2O_3$, $SiO_2$, $Y_2O_3$, etc. In another implementation, the interface layer 645b may include a continuous film of $Al_2O_3$, $SiO_2$, $Y_2O_3$, etc.

Figure 6C:
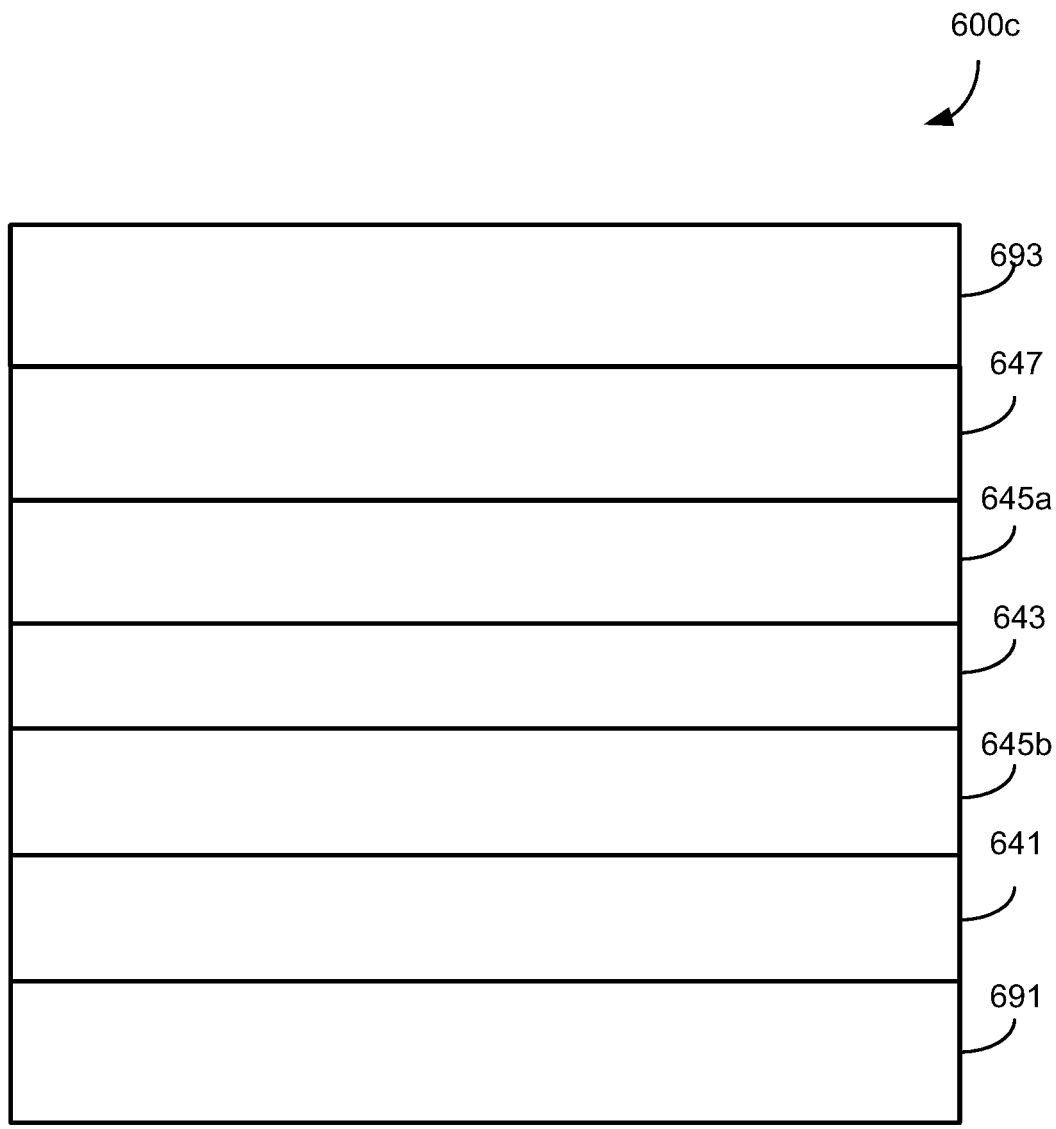

As shown in FIG. 6C, the RRAM device 600c may include a first diffusion barrier 691, a bottom electrode 641, an interface layer 645b, a switching oxide layer 643, an interface layer 645a, a top electrode 647, and a second diffusion barrier 693. The bottom electrode 641, the interface layer 645b, the switching oxide layer 643, the interface layer 645a, and the top electrode 647 may be the same as their counterparts as described in connection with FIGS. 6A-6B above. The first diffusion barrier 691 may be fabricated between the first interconnect layer 411 of FIGS. 4A-5M (not shown in FIG. 6C) and the bottom electrode 641. The second diffusion barrier 693 may be fabricated between the top electrode 647 and the second interconnect layer 413 of FIGS. 4A-5M (not shown in FIG. 6C).

The first diffusion barrier 691 and the second diffusion barrier 693 may include any suitable material that may prevent metals in the interconnect layers from diffusing into the RRAM device at annealing temperatures and may exhibit suitable thermal and chemical stability, conductivity, and adhesion. In some embodiments, the first diffusion barrier 691 and/or the second diffusion barrier 693 may include one or more layers of TaN, TiN, etc.

The first diffusion barrier 691 and/or the second diffusion barrier 693 may further enhance the annealing resistance of the RRAM device and prevent metals in the interconnects (e.g., Cu, Al, W) from diffusing into the RRAM device.

Figure 6D:
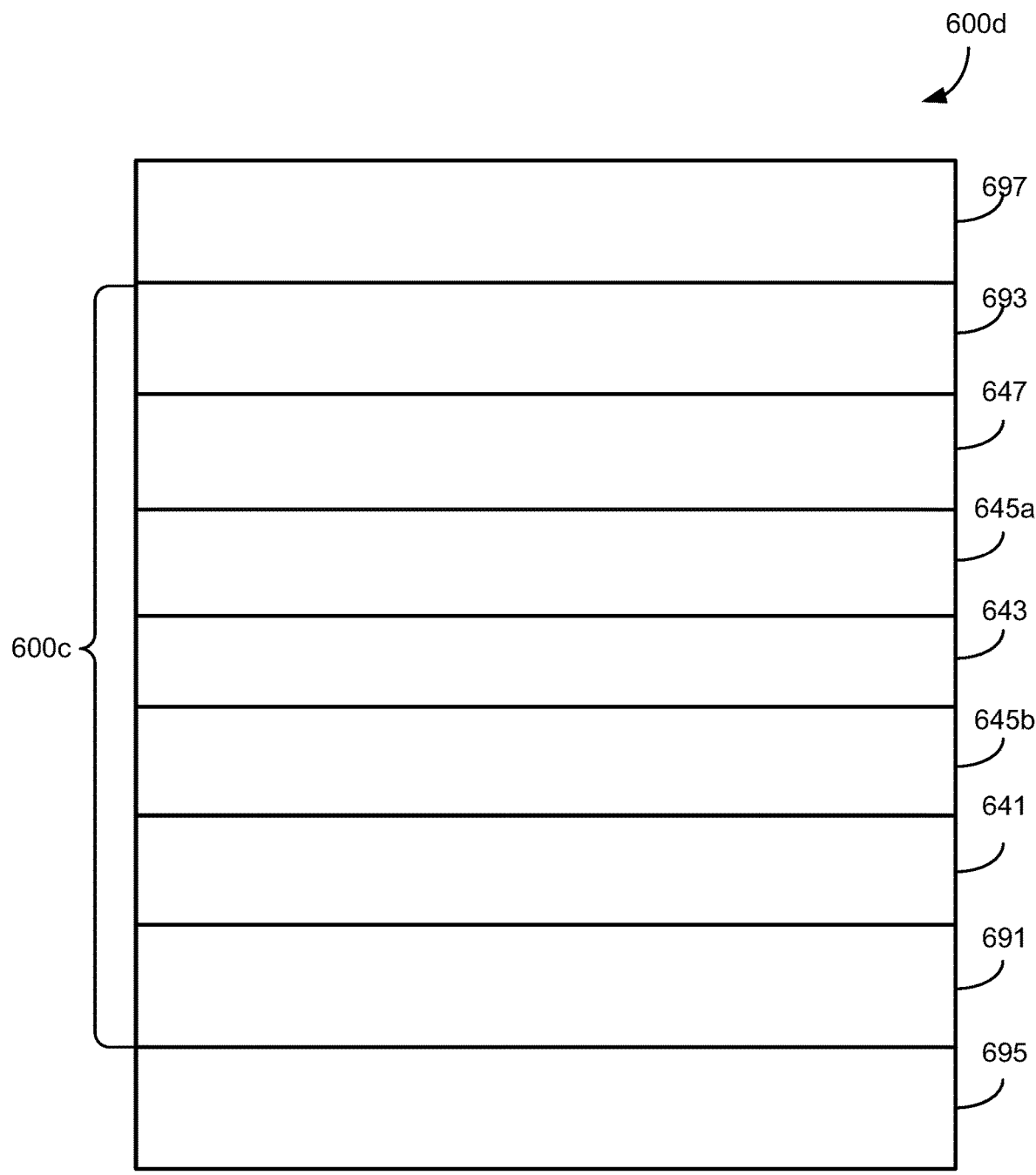

In some embodiments, one or more adhesion layers may be fabricated between the RRAM device 600c and the interconnect layers. For example, as shown in FIG. 6D, the RRAM device 600c may be fabricated on a first adhesion layer 695. The first adhesion layer 695 may be fabricated on the top interconnect layer of the first interconnect layers 310a of FIGS. 3A-3B (not shown in FIG. 6D).

A second adhesion layer 697 may be fabricated on the RRAM device 600c and/or the second diffusion barrier 693. One or more second interconnect layers 310b of FIGS. 3A-4F (not shown in FIG. 6D) may be fabricated on the second adhesion layer 697. Each of the first adhesion layer 695 and the second adhesion layer 697 may include one or more layers of Ti, Ta, or conductive oxide such as $Ti_4O_7$, etc.

Figure 6E:
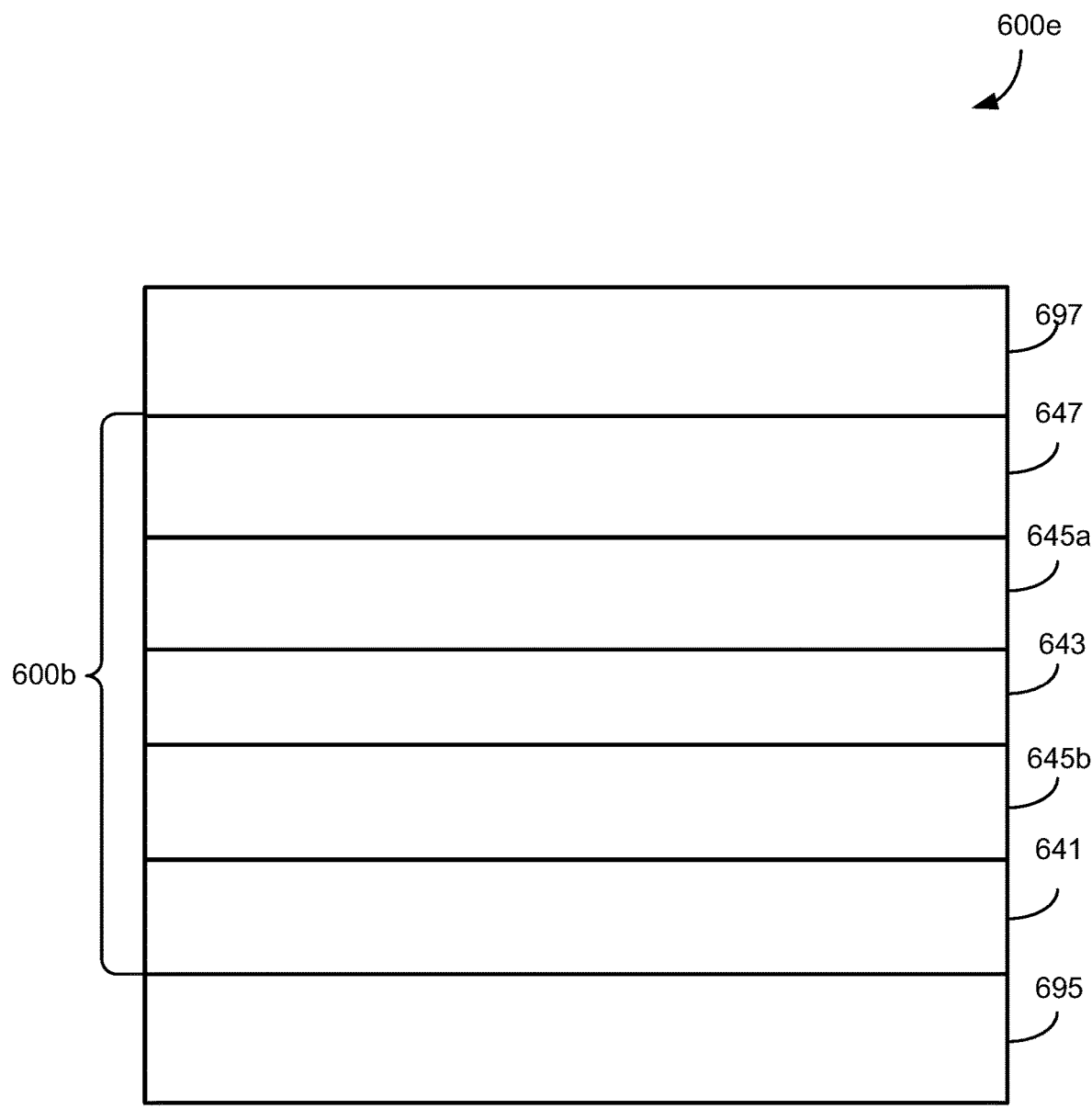

In some embodiments, the first diffusion barrier 691 and/or the second diffusion barrier 693 may be omitted from RRAM 600d. For example, as shown in FIG. 6E, RRAM device 600e may include the RRAM device 600b fabricated on the first adhesion layer 695. The second adhesion layer 697 may be fabricated on the top electrode 647.

Figure 7:
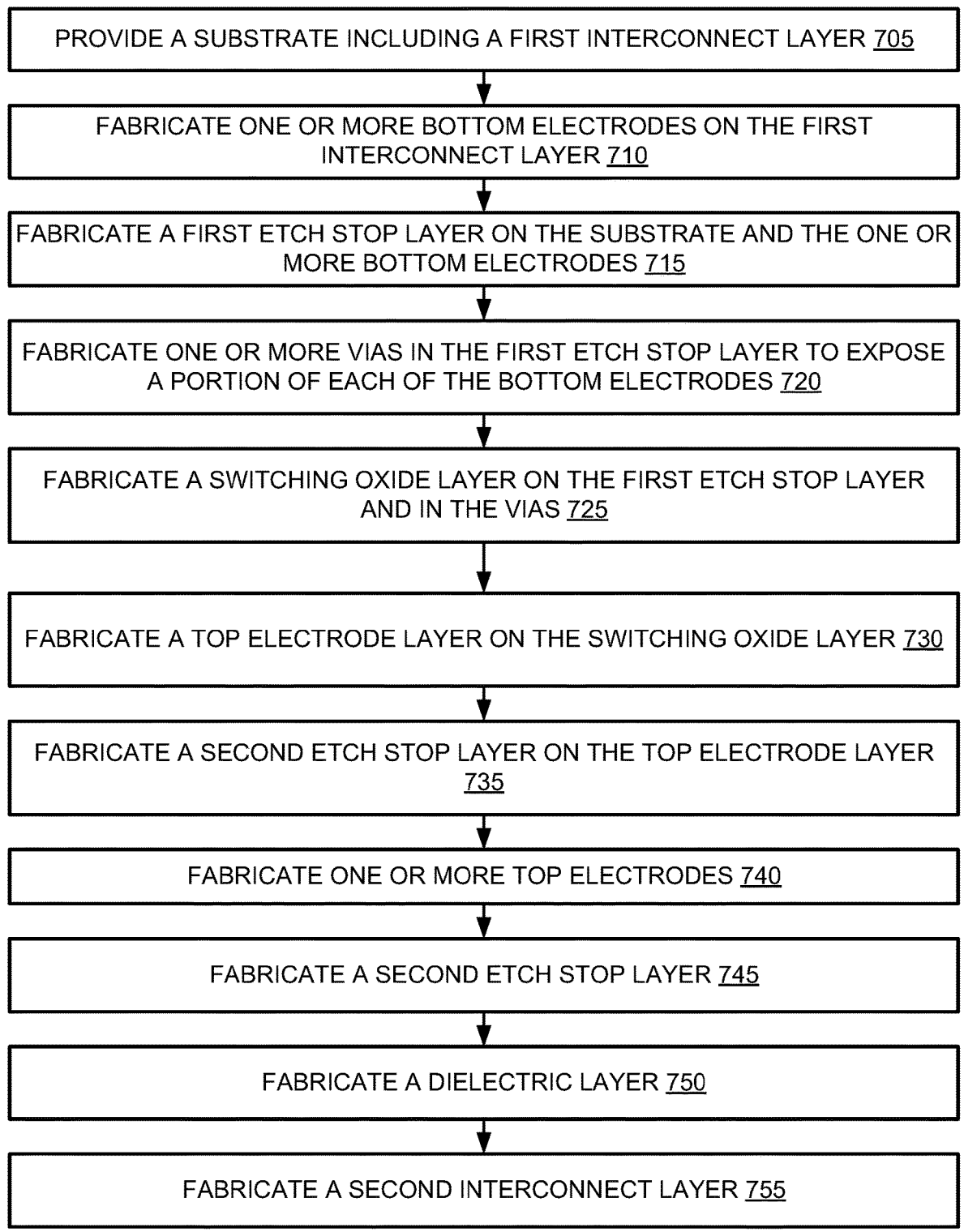
FIG. 7 is a flowchart illustrating an example process for fabricating a crossbar circuit in accordance with some embodiments of the present disclosure.

FIG. 7 is a flowchart illustrating example process 700 for fabricating a crossbar circuit including CMOS-compatible RRAMs in accordance with some embodiments of the present disclosure.

As shown, process 700 may start at 705 where a substrate including a first interconnect layer is provided. The first interconnect layer may include one or more metal pads and/or metal vias for connecting the bottom electrodes and one/or more other components of the semiconductor device. The substrate may be the substrate 410 of FIG. 4A.

At block 710, one or more bottom electrodes may be fabricated on the first interconnect layer. For example, a first bottom electrode of a first RRAM device may be fabricated on a first metal pad or metal via of the first interconnect layer. The first metal pad or metal via may be connected to a first transistor. As another example, a second bottom electrode of a second RRAM device may be fabricated on a second metal pad or metal via of the first interconnect layer. The second metal pad or metal via may be connected to a second transistor. The bottom electrodes may include bottom electrodes 421a and 421b and may be fabricated as described in connection with FIGS. 4B, 5B, and 5C.

Fabricating the one or more bottom electrodes may involve depositing, on the first interconnect layer and the substrate, a bottom electrode layer of one or more nonactive metals, such as Pt, Pd, Ir, etc. utilizing a physical vapor deposition (PVD) technique, a chemical vapor deposition (CVD) technique, a sputtering deposition technique, an atomic layer deposition (ALD) technique, and/or any other suitable deposition technique. In some embodiments, fabricating the bottom electrode layer may involve depositing one or more layers of Pt. The bottom electrode layer may then be patterned and etched to fabricate the bottom electrodes. In some embodiments, fabricating the bottom electrode layer may include depositing a metal nitride on a metal pad or metal via of the first interconnect layer. The metal nitride may include, for example, tantalum nitride, titanium nitride, etc.

At block 715, a first etch stop layer may be fabricated on the substrate and the one or more bottom electrodes. Fabricating the first etch stop layer may involve depositing one or more materials that are resistant to the etching of a dielectric layer (e.g., a $SiO_2$ layer) to be fabricated on the first etch stop layer. For example, fabricating the first etch stop layer may involve depositing one or more layers of $SiN_x$, $SiO_xN_y$, etc. utilizing CVD techniques, ALD techniques, magnetron sputtering techniques, etc. The first etch stop layer may be deposited on the bottom electrodes and the portions of the substrate that are not covered by the bottom electrodes. The first etch stop layer may be the etch stop layer 430 as described in connection with FIGS. 4C and 5D.

At block 720, one or more vias may be fabricated in the first etch stop layer to expose at least a portion of each of the bottom electrodes. For example, the first etch stop layer may be patterned and etched to create a first via in the first etch stop layer to expose a portion of the first bottom electrode and/or to create a second via in the first etch stop layer to expose a portion of the second bottom electrode. The via bottom of the first via and the via bottom of the second via may directly contact the first bottom electrode and the second bottom electrode, respectively. The vias may include vias 431 and 433 as described in connection with FIGS. 4D and 5E.

At block 725, a switching oxide layer may be fabricated on the first etch stop layer and in the vias. For example, fabricating the switching oxide layer may involve depositing one or more switching metal oxides, such as $TaO_x$, $HfO_x$, $TiO_x$, $NbO_x$, $ZrO_x$, etc. The switching oxide layer may be deposited utilizing an atomic layer deposition (ALD) technique, physical vapor deposition (PVD) technique, chemical vapor deposition (CVD) technique, and/or any other suitable deposition technique. In some embodiments, the switching oxide layer may be fabricated utilizing bottom anti-reflective coatings (BARC) and/or deep UV (DUV) lithography techniques.

The switching oxide layer may be conformally fabricated on the portion of the first etch stop layer that surrounds the vias, along the sidewalls of the vias, and on the exposed portions of the bottom electrodes. The fabrication of the switching oxide layer may partially fill the vias. The switching oxide layer may be fabricated as described in connection with FIGS. 4E and 5F above.

At block 730, a top electrode layer may be fabricated on the switching oxide layer. For example, fabricating the top electrode layer may involve depositing one or more suitable metallic materials that are electrically conductive and reactive to the switching oxide in the switching oxide layer, such as Ta, Hf, Ti, TiN, TaN, etc. The top electrode layer may be fabricated on the switching oxide layer and along the sidewalls of the vias. The top electrode layer may be top electrode layer 425 as described in connection with FIGS. 4F and 5G above. In some embodiments, the top electrode layer may be fabricated utilizing in situ pre-sputtering etching techniques.

At block 735, a second etch stop layer may be fabricated on the top electrode layer. Fabricating the second etch stop layer may involve depositing one or more materials that are resistant to the etching of a dielectric layer to be fabricated on the second etch stop layer. For example, fabricating the second etch stop layer may involve depositing one or more layers of $SiN_x$, $SiO_xN_y$, etc. utilizing CVD techniques, ALD techniques, magnetron sputtering techniques, etc. The fabrication of the second etch stop layer may completely fill the vias in some embodiments. The second etch stop layer may be etch stop layer 450 as described in connection with FIGS. 4G and 5H above.

At block 740, one or more top electrodes may be fabricated by selectively removing one or more portions of the second etch stop layer and the top electrode layer. For example, the second etch stop layer may be patterned. The second etch stop layer and the top electrode layer may then be etched to fabricate a first top electrode of the first RRAM device and a second top electrode of the second RRAM device. The etching of the second etch stop layer and the top electrode layer may stop on the switching oxide layer or the first etch stop layer. The top electrodes may include top electrodes 450*a-b* and may be fabricated as described in connection with FIGS. 4H and 5I above.

In one implementation, at block 745, one or more portions of the switching oxide layer may be selectively removed to fabricate a filament-forming layer for each of the RRAM devices to be fabricated (e.g., filament-forming layers 443*a* and 443*b* of FIGS. 4H and 5I). In another implementation, the switching oxide layer is not etched and may function as the filament-forming layer of the RRAM device(s). Blocks 745 and 740 may be performed sequentially, simultaneously, or substantially simultaneously.

At block 750, a dielectric layer may be fabricated on the second etch stop layer and the first etch stop layer. Fabricating the dielectric layer may involve depositing one or more suitable materials that may be used as an interlayer dielectric (ILD). As an example, fabricating the second isolation layer may involve depositing one or more layers of $SiO_2$. The ILD material may be deposited on the top surface of the first etch stop layer and the top surface of the second etch stop layer. The dielectric layer may be dielectric layer 460 and may be fabricated as described in connection with FIGS. 4I and 5J above.

At block 755, a second interconnect layer may be fabricated. The second interconnect layer may include a plurality of metal pads and/or metal vias. For example, the second interconnect layer may include a first metal via and a second metal via that are fabricated in the dielectric layer and the second etch stop layer. As another example, the second interconnect layer may include a third metal via that is fabricated in the dielectric layer and the first etch stop layer. The third metal via may be part of a peripheral circuit that does not include an RRAM device.

For example, the dielectric layer may be patterned and etched to fabricate the top portion of one or more via trenches (e.g., a first portion of a first via trench, a first portion of a second via trench, a first portion of a third via trench, etc.). The etching of the dielectric layer may stop on the etched second etch stop layer and the exposed first etch stop layer. A second portion of the first via trench and a second portion of the second via trench may then be fabricated by patterning and etching the second etch stop layer. The etching of the second etch stop layer stops on the top electrode(s) (e.g., the first top electrode of the first RRAM device, the second top electrode of the second RRAM device, etc.). A second portion of the third via trench may be fabricated by patterning and etching the first etch stop layer in the periphery circuit. Suitable metallic materials (e.g., Cu, Al, W, etc.) may be deposited in the via trenches and patterned to fabricate one or more metal vias and/or metal pads. The metallic material may be deposited utilizing CVD, PVD, and/or any other suitable deposition technique. In some embodiments, fabricating the second interconnect layer may include fabricating metal vias 413*a*, 413*b*, 413*c*, and 413*d* as described in connection with FIGS. 4J-4M and 5K-5M above.

Figure 8:
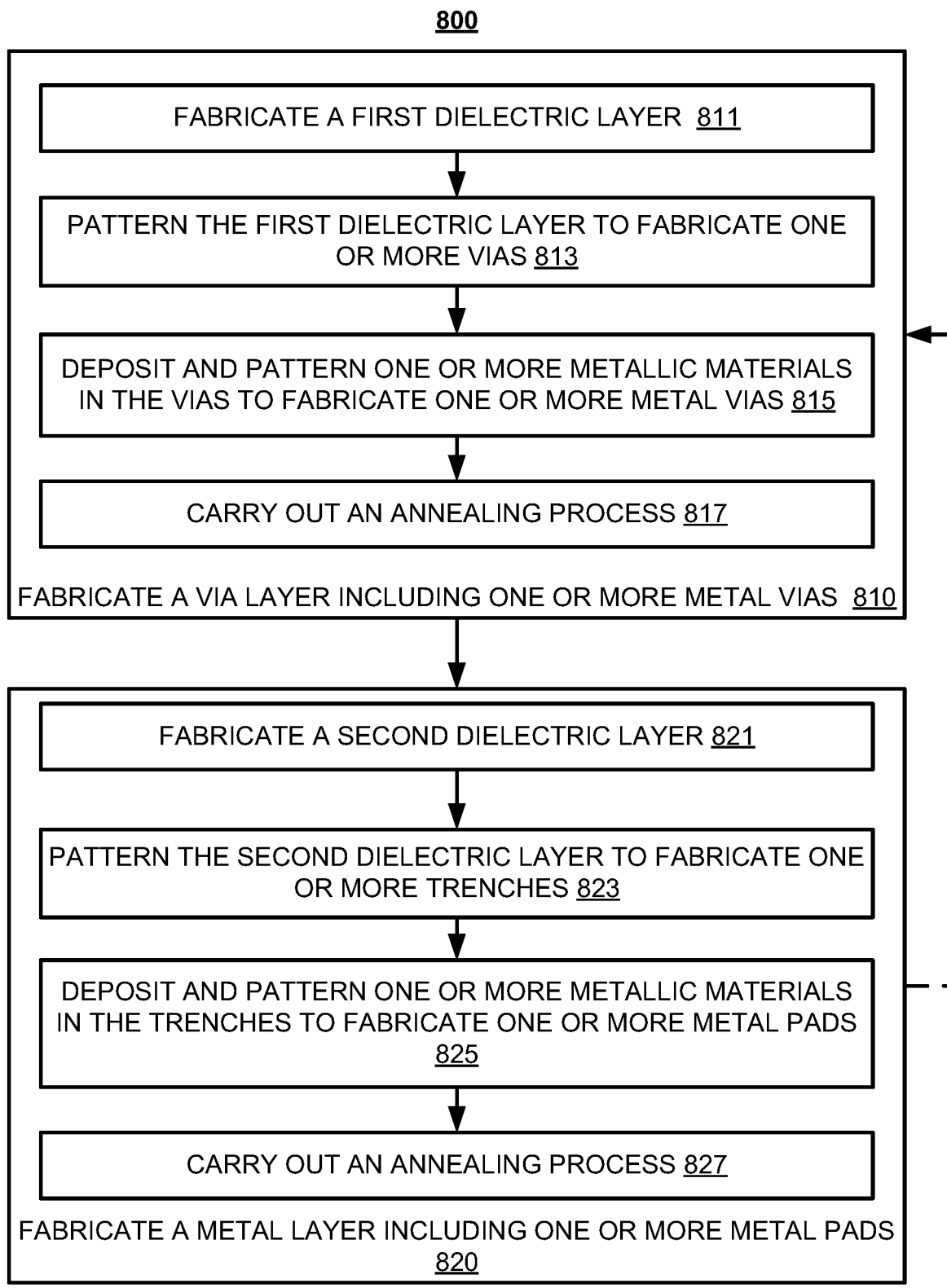
FIG. 8 is a flowchart illustrating an example process for fabricating one or more interconnect layers in accordance with some embodiments of the present disclosure.

FIG. 8 is a flowchart illustrating an example process 800 for fabricating one or more interconnect layers in accordance with some embodiments of the present disclosure.

At 810, a via layer including one or more metal vias may be fabricated. To fabricate the via layer, a first dielectric layer of a first dielectric material may be fabricated at 811. For example, a layer of the first dielectric material (e.g., $Si_3N_4$, $SiO_2$, etc.) may be deposited using suitable deposition techniques, such as chemical vapor deposition (CVD), atomic layer deposition (ALD), plasma-enhanced chemical vapor deposition (PECVD), sputtering, etc.

At 813, the first dielectric layer may be patterned to create one or more vias. The first dielectric layer may be patterned using any suitable dry and wet etching techniques.

At 815, one or more suitable metallic materials may be deposited in the vias and patterned to fabricate one or more metal vias. For example, the first vias may be filled by depositing Cu, Al, W, and/or any other suitable metal utilizing CVD, PVD, and/or any other suitable deposition technique.

At 817, an annealing process is carried out. For example, the first via layer may be annealed in a forming gas ambient at suitable temperatures (e.g., 350-450° C.) for a suitable period of time (e.g., 15-30 minutes). The forming gas may include a mixture of nitrogen ($N_2$) and hydrogen ($H_2$) in a suitable ratio (e.g., 95:5, 90:10, etc.).

At 820, a metal layer including one or more metal pads may be fabricated on the via layer. To fabricate the metal layer, a second dielectric layer of a second dielectric material may be fabricated at 821. For example, a layer of the second dielectric material (e.g., $SiO_2$, $Si_3N_4$) may be deposited on the via layer using suitable deposition techniques, such as chemical vapor deposition (CVD), ALD, sputtering, etc.

At 823, the second dielectric layer may be patterned to create one or more trenches. The second dielectric layer may be patterned using any suitable dry and wet etching techniques.

At 825, one or more suitable metallic materials may be deposited in the trenches and patterned to fabricate one or more metal pads. For example, the second vias may be filled by depositing Cu, Al, W, and/or any other suitable metal utilizing CVD, PVD, and/or any other suitable deposition technique.

At 827, an annealing process is carried out. For example, the metal layer may be annealed in a forming gas ambient at suitable temperatures (e.g., 350-450° C.) for a suitable period of time (e.g., 15-30 minutes). The forming gas may include a mixture of nitrogen ($N_2$) and hydrogen ($H_2$) in a suitable ratio (e.g., 95:5, 90:10, etc.).

The process 800 may be performed iteratively to fabricate a suitable number of interconnect layers. For example, the process 800 may loop back to 810 after performing block 820 and may fabricate a second via layer on the metal layer fabricated at 820. In particular, a third dielectric layer of a third dielectric material may be fabricated. The third dielectric layer may be patterned to create one or more third vias. One or more suitable metallic materials may be deposited in the third vias to fabricate one or more metal vias. Annealing process may then be carried out. A second metal layer may be fabricated on the second via layer in some embodiments. Additional layers of via layers and/or metal layers may be fabricated by performing blocks 810 and/or 820 iteratively.

Figure 9A:
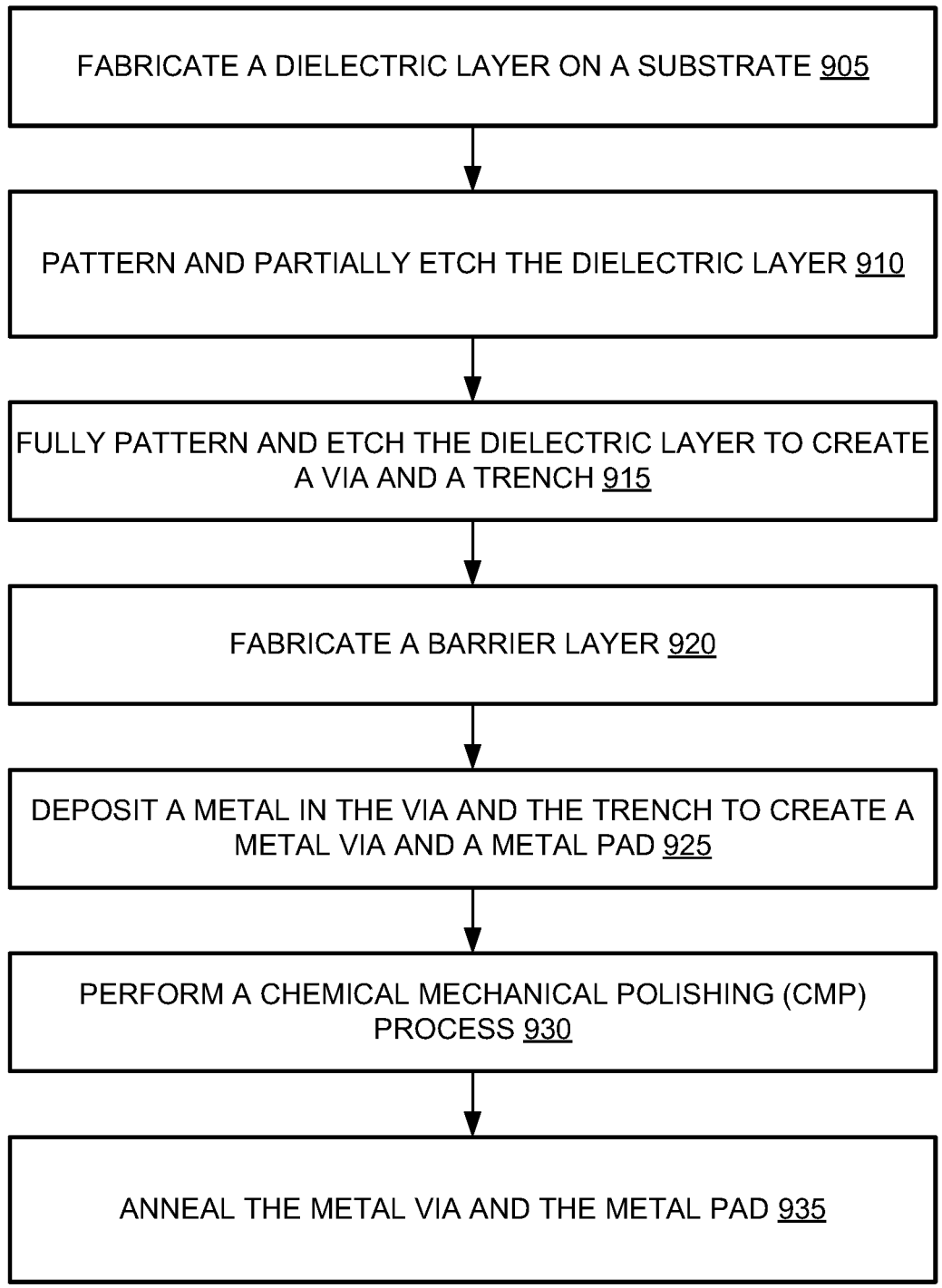
FIG. 9A is a flow chart illustrating an example process for fabricating an interconnect structure including a metal via and a metal pad in one process.

FIG. 9A is a flow chart illustrating an example process 900 for fabricating an interconnect structure including a metal via and a metal pad in one process. FIGS. 9B-9G illustrate cross-sectional views of structures for fabricating an interconnect structure 990 by implementing process 900 in accordance with some embodiments of the present disclosure.

Figure 9B:
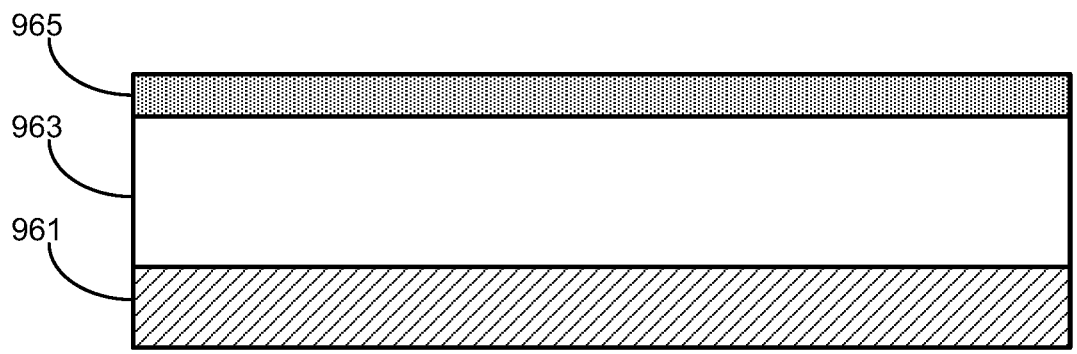
FIGS. 9B-9G illustrate cross-sectional views of structures for fabricating an interconnect structure by implementing the process of FIG. 9A in accordance with some embodiments of the present disclosure.

As shown, process 900 may start at 905 by fabricating a dielectric layer on a substrate. The substrate may be and/or include one or more transistors, interconnect layers, etc. Depositing the dielectric layer may involve depositing one or more interlayer dielectrics (ILDs), such as $SiO_2$, $Si_3N_4$, $Al_2O_3$, etc. For example, as shown in FIG. 9B, a dielectric layer 963 may be fabricated on a substrate 961. In some embodiments, a resist 965 may be fabricated on the dielectric layer 963.

Figure 9C:
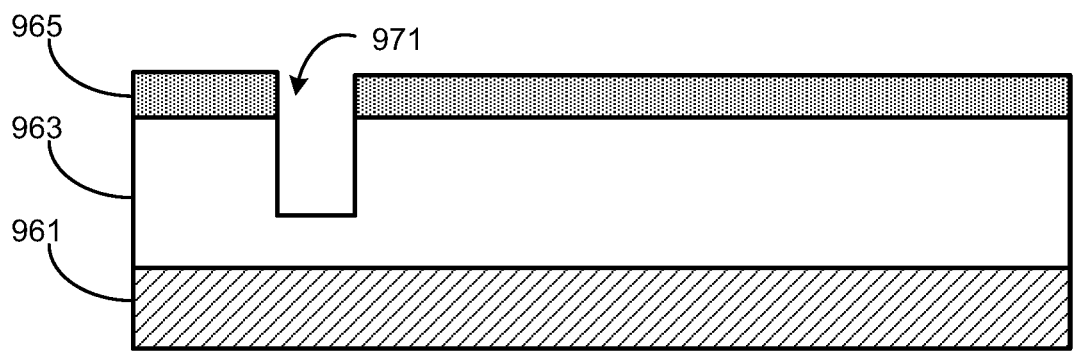

At 910, the dielectric layer may be patterned and partially etched. That is, the dielectric layer is partially etched in depth. For example, as shown in FIG. 9C, a via 971 may be fabricated by partially etching the dielectric layer 963 and the resist 965.

Figure 9D:
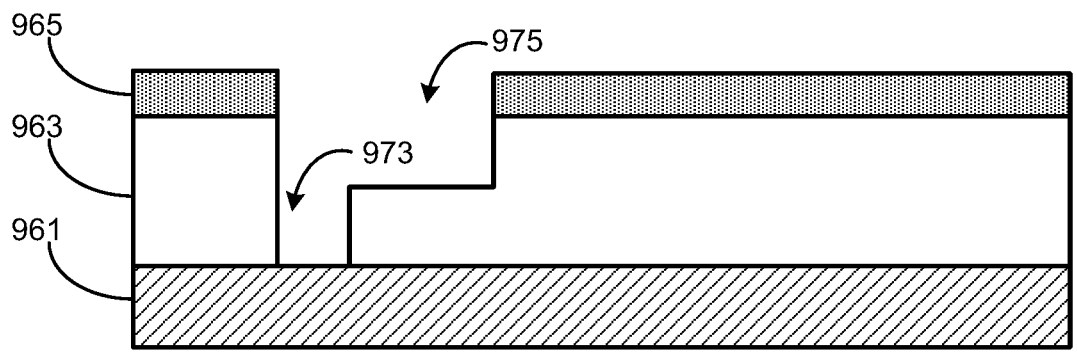

At 915, the partially etched dielectric layer may be fully etched to create a via and/or a trench. The dielectric is fully etched in depth while maintaining an etching profile for via and trench due to the conformal etching. For example, as shown in FIG. 9D, a via 973 and a trench 975 may be created by etching the partially etched dielectric layer 963 and the resist 965.

Figure 9E:
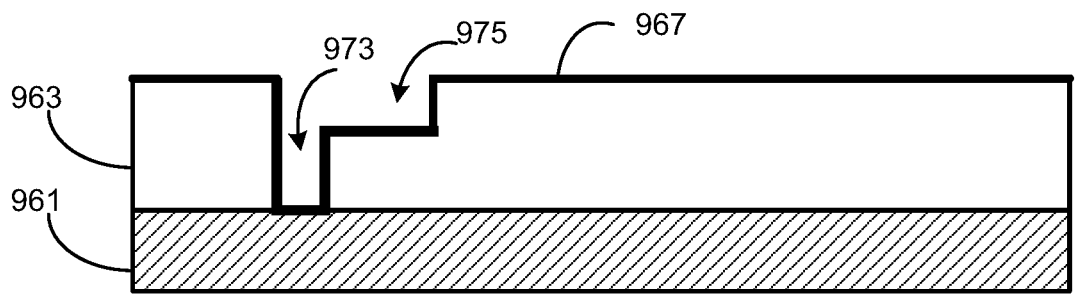

At 920, a barrier layer may be fabricated. For example, as shown in FIG. 9E, a barrier layer 967 (e.g., a layer including Ta or TaN) may be deposited on the fully etched dielectric layer and over the sidewalls of the via 973 and the trench 975.

At 925, a metal may be deposited to create a metal via and a metal pad. For example, a thin Cu seed layer may be deposited by physical vapor deposition (PVD) followed by the electroplating of Cu, which fills the via and the trench. The metal deposition may also create one or more metal wires. As shown in FIG. 9E, a metal may be deposited (e.g., by plating) in the via 973 and the trench 975 to create a metal via 981 and a metal pad 983, respectively.

Figure 9F:
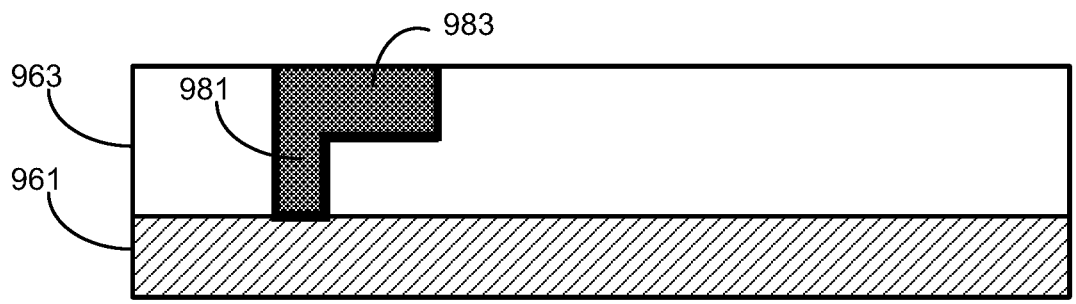
Figure 9G:
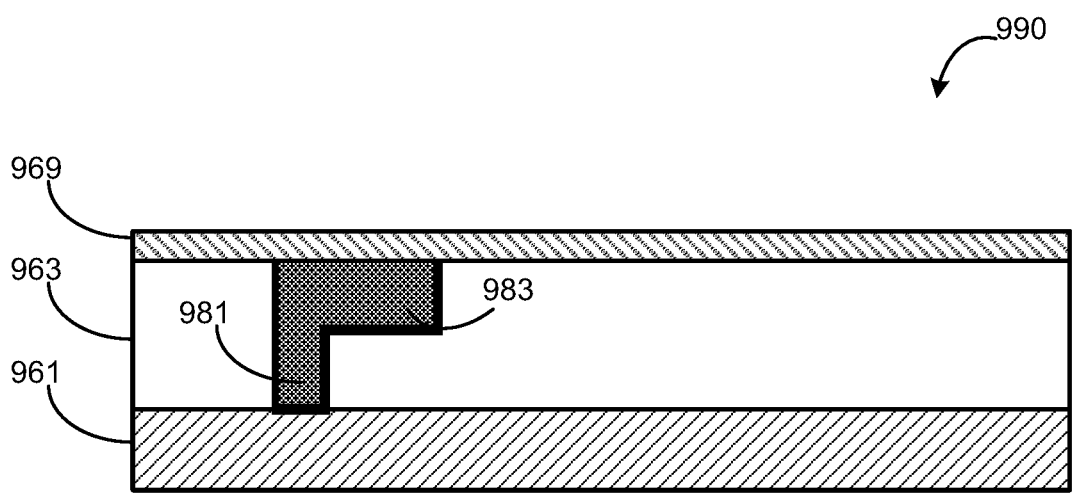

At 930, a chemical mechanical polishing (CMP) process is performed. For example, the metal via 981, the metal pad 983, and metal wires (not shown) may be patterned and processed in the CMP process to remove excess Cu and planarize the surface, as shown in FIG. 9F. In some embodiments, as shown in FIG. 9G, a capping layer 969 (e.g., a SiN layer) may be deposited.

At 935, the metal via and the metal pad may be annealed. For example, the interconnect structure 990 of FIG. 9G may be annealed at the annealing temperatures (e.g., 350-450° C.) in a forming gas flow (e.g., a mixture of $N_2$ and $H_2$) for a suitable period of time (e.g., 15-30 minutes).

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. In some embodiments, an etched surface and/or sidewall of the RRAM device may be cleaned prior to further processing.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. An apparatus, comprising:
  a first resistive random-access memory (RRAM) device, comprising:
    a first bottom electrode fabricated on a first interconnect layer;
    a first top electrode;
    a first filament-forming layer fabricated between the first bottom electrode and the first top electrode, wherein the first filament-forming layer comprises at least one switching metal oxide, and wherein a first filament-forming region of the first filament-forming layer and at least a portion of the first top electrode are fabricated in a first via in a first etch stop layer;
    a second etch stop layer fabricated on the first top electrode;
    a dielectric layer fabricated on the second etch stop layer; and
    a first metal via of a second interconnect layer fabricated in the second etch stop layer and the dielectric layer, wherein the first top electrode is connected to a bitline through the first metal via of the second interconnect layer;
    wherein a critical device size of the first RRAM device is defined by a dimension of the first filament-forming region and an opening size of the first metal via.

2. The apparatus of claim 1, wherein the first bottom electrode is fabricated on a first metal pad of the first interconnect layer, and wherein the first metal pad of the first interconnect layer is connected to a first transistor.

3. The apparatus of claim 1, wherein the switching metal oxide comprises at least one of $HfO_x$, $TaO_x$, $TiO_x$, $NbO_x$, $ZrO_x$.

4. The apparatus of claim 3, wherein the first RRAM device further comprises an interface layer fabricated between the first top electrode and the first filament-forming layer, wherein the interface layer comprises at least one of $Al_2O_3$, $MgO$, $Y_2O_3$, or $La_2O_3$.

5. The apparatus of claim 3, wherein the first RRAM device further comprises an interface layer fabricated between the first bottom electrode and the first filament-forming layer, wherein the interface layer comprises at least one of $Al_2O_3$, $MgO$, $Y_2O_3$, or $La_2O_3$.

6. The apparatus of claim 1, wherein the dielectric layer comprises $SiO_2$.

7. The apparatus of claim 6, wherein the first etch stop layer comprises at least one of silicon nitride or silicon oxynitride.

8. The apparatus of claim 6, wherein the second etch stop layer comprises at least one of silicon nitride or silicon oxynitride.

9. The apparatus of claim 1, further comprising a second RRAM device, the second RRAM device comprising:
  a second bottom electrode fabricated on the first interconnect layer;
  a second top electrode; and
  a second filament-forming layer fabricated between the second bottom electrode and the second top electrode, and wherein a second filament-forming region of the second filament-forming layer and at least a portion of the second top electrode are fabricated in a second via in the first etch stop layer.

10. The apparatus of claim 9, wherein the second bottom electrode is fabricated on a second metal pad of the first interconnect layer, and wherein the second metal pad of the first interconnect layer is connected to a second transistor.

11. The apparatus of claim 9, wherein a second metal via of the second interconnect layer is fabricated in the dielectric layer and the second etch stop layer, and wherein the second top electrode is connected to a bitline through the second metal via of the second interconnect layer.

12. The apparatus of claim 9, further comprising:
  a periphery circuit, comprising:
    a third metal pad of the first interconnect layer; and
    a third metal via of the second interconnect layer, wherein a portion of the first etch stop layer is fabricated on the third metal pad of the first interconnect layer, wherein the third metal via is fabricated in a third via trench positioned in the dielectric layer and the portion of the first etch stop layer, and wherein the periphery circuit does not include the second etch stop layer.

13. The apparatus of claim 12, wherein the third metal via of the second interconnect layer connects the third metal pad of the first interconnect layer to a metal pad of a third interconnect layer.

14. A method, comprising:
  fabricating one or more bottom electrodes on a substrate comprising a first interconnect layer;
  fabricating a first etch stop layer on the substrate and the one or more bottom electrodes;
  fabricating one or more vias in the first etch stop layer to expose a portion of each of the bottom electrodes;
  fabricating a switching oxide layer on the first etch stop layer, wherein at least a portion of the switching oxide layer is fabricated on the exposed portion of the bottom electrodes;
  fabricating a top electrode layer on the switching oxide layer;
  fabricating a second etch stop layer on the switching oxide layer; and
  fabricating one or more top electrodes by selectively removing one or more portions of the second etch stop layer and the top electrode layer.

15. The method of claim 14, wherein fabricating the one or more bottom electrodes on the first interconnect layer comprises fabricating a first bottom electrode on a first metal pad of the first interconnect layer, and wherein fabricating the one or more vias in the first etch stop layer comprises fabricating a first via in the first etch stop layer to expose a portion of the first bottom electrode.

16. The method of claim 15, wherein fabricating the one or more top electrodes comprises:
    patterning the second etch stop layer; and
    etching the second etch stop layer and the top electrode layer.

17. The method of claim 16, wherein fabricating the one or more bottom electrodes on the first interconnect layer comprises fabricating a second bottom electrode on a second metal pad of the first interconnect layer, and wherein fabricating the one or more vias in the first etch stop layer comprises fabricating a second via in the first etch stop layer to expose a portion of the second bottom electrode.

18. The method of claim 14, further comprising:
    fabricating a dielectric layer on the second etch stop layer; and
    fabricating a second interconnect layer that connects the first interconnect layer to a third interconnect layer, wherein a first metal via of the second interconnect layer is fabricated in the dielectric layer and the second etch stop layer, and wherein a first metal pad of the first interconnect layer is connected to a first metal pad of the third interconnect layer via the first metal via of the second interconnect layer.

19. The method of claim 18, wherein fabricating the second interconnect layer comprises:
    patterning and etching the dielectric layer to fabricate a first portion of a first via trench;
    patterning and etching the second etch stop layer to fabricate a second portion of the first via trench; and
    depositing a metallic material in the first via trench to fabricate the first metal via of the second interconnect layer.

20. The method of claim 19, wherein the etching of the dielectric layer stops on the second etch stop layer, and wherein the etching of the second etch stop layer stops on the top electrode layer.

* * * * *